(12) United States Patent
Kitazawa et al.

(10) Patent No.: US 12,364,128 B2
(45) Date of Patent: Jul. 15, 2025

(54) LIGHT EMITTING DEVICE

(71) Applicant: SHARP KABUSHIKI KAISHA, Sakai (JP)

(72) Inventors: Tazuko Kitazawa, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 526 days.

(21) Appl. No.: 17/771,259

(22) PCT Filed: Nov. 6, 2019

(86) PCT No.: PCT/JP2019/043514
§ 371 (c)(1),
(2) Date: Apr. 22, 2022

(87) PCT Pub. No.: WO2021/090407
PCT Pub. Date: May 14, 2021

(65) Prior Publication Data
US 2022/0376004 A1 Nov. 24, 2022

(51) Int. Cl.
*H10K 59/32* (2023.01)
*H10K 50/86* (2023.01)
(Continued)

(52) U.S. Cl.
CPC ........... *H10K 59/32* (2023.02); *H10K 50/865* (2023.02); *H10K 59/353* (2023.02);
(Continued)

(58) Field of Classification Search
CPC .... H10K 59/12; H10K 59/121; H10K 59/122; H10K 59/1213; H10K 59/123–125;
(Continued)

(56) References Cited

U.S. PATENT DOCUMENTS

| 2001/0033347 A1 | 10/2001 | Kitahora et al. |
| 2011/0068330 A1* | 3/2011 | Akimoto ............... H10K 59/878 257/40 |

(Continued)

FOREIGN PATENT DOCUMENTS

| JP | 2001-265251 A | 9/2001 |
| JP | 2006-128242 A | 5/2006 |

(Continued)

OTHER PUBLICATIONS

Uchida et al., "Full Color Pixel with Vertical Stack of Individual Red, Green, and Blue Transparent Organic Light-Emitting Devices Based on Dye-Dispersed Poly(N-vinylcarbazole)", Japanese Journal of Applied Physics, vol. 45, No. 9A, Sep. 2006, pp. 7126-7128.

*Primary Examiner* — Wael M Fahmy
*Assistant Examiner* — Quinton A Brasfield
(74) *Attorney, Agent, or Firm* — ScienBiziP, P.C.

(57) ABSTRACT

A light-emitting device includes, on a substrate, a red pixel electrode and a green pixel electrode, a common electrode, and a blue pixel electrode, in order from the substrate side, and includes a transparent region adjacent to a light-emitting region including a position overlapping the red light-emitting layer, the green light-emitting layer, and the blue light-emitting layer in a plan view. At least a part of the blue light-emitting layer overlaps the red light-emitting layer and the green light-emitting layer adjacent to the red light-emitting layer in the plan view.

15 Claims, 21 Drawing Sheets

(51) Int. Cl.
*H10K 59/12* (2023.01)
*H10K 59/122* (2023.01)
*H10K 59/35* (2023.01)
*H10K 59/80* (2023.01)
*H10K 71/00* (2023.01)

(52) U.S. Cl.
CPC . *H10K 59/80517* (2023.02); *H10K 59/80524* (2023.02); *H10K 59/879* (2023.02); *H10K 59/8792* (2023.02); *H10K 71/00* (2023.02); *H10K 59/12* (2023.02); *H10K 59/1201* (2023.02); *H10K 59/122* (2023.02)

(58) Field of Classification Search
CPC .......... H10K 59/32; H10K 59/35–353; H10K 59/878–879; H10K 59/8791; H10K 59/8792; H10K 50/13; H10K 50/131; H10K 59/80517; H10K 59/80524; H01L 25/0657; H01L 25/0652; H01L 25/043; H01L 25/071; H01L 25/074; H01L 25/0756; H01L 25/112; H01L 25/117; H01L 2224/08145; H01L 27/0688; H05B 33/04
See application file for complete search history.

(56) References Cited

U.S. PATENT DOCUMENTS

| | | | |
|---|---|---|---|
| 2011/0085068 A1* | 4/2011 | Ito | H10K 59/32 348/333.01 |
| 2011/0121753 A1* | 5/2011 | Nagayama | H10K 59/32 257/40 |
| 2012/0199859 A1* | 8/2012 | Shikina | H10K 59/879 257/40 |
| 2017/0104035 A1* | 4/2017 | Lee | H10K 50/81 |
| 2017/0278894 A1* | 9/2017 | Sato | G09F 9/33 |
| 2017/0294488 A1* | 10/2017 | Lin | H10K 59/1213 |
| 2019/0123306 A1* | 4/2019 | Liang | H10K 71/00 |
| 2019/0173057 A1* | 6/2019 | Jung | H10K 50/86 |
| 2020/0013838 A1* | 1/2020 | Takechi | H10K 59/121 |

FOREIGN PATENT DOCUMENTS

| | | |
|---|---|---|
| JP | 2010-123286 A | 6/2010 |
| JP | 2016-076327 A | 5/2016 |

* cited by examiner

LIGHT EMITTING DEVICE

TECHNICAL FIELD

The disclosure relates to a light-emitting device including a light-emitting layer.

BACKGROUND ART

NPL 1 discloses an organic light-emitting device in which a red light-emitting layer, a green light-emitting layer, and a blue light-emitting layer are layered together.

CITATION LIST

Non Patent Literature

NPL 1: Full Color Pixel with Vertical Stack of Individual Red, Green, and Blue Transparent Organic Light-Emitting Devices Based on Dye-Dispersed Poly (N-vinyl carbazole) (Uchida, et al, Japanese Journal of Applied Physics Vol. 45, No. 9A, 2006, pp. 7126-7128.)

SUMMARY

Technical Problem

A layering type light-emitting device as described in NPL 1 has room to be able to reduce the number of layers and also transmit more background light.

An object of an aspect of the disclosure is to achieve a configuration in which the number of layers of a light-emitting device can be reduced, and more background light can be transmitted.

Solution to Problem

A light-emitting device according to the disclosure includes: on a substrate, a lower layer pixel electrode provided in an island shape, a common electrode being common to a plurality of subpixels, and a blue pixel electrode provided in an island shape, in order from the substrate side; the lower layer pixel electrode including a red pixel electrode and a green pixel electrode adjacent to the red pixel electrode, a red light-emitting layer located between the red pixel electrode and the common electrode; a green light-emitting layer located between the green pixel electrode and the common electrode; a blue light-emitting layer located between the common electrode and the blue pixel electrode; and a transparent region adjacent to a light-emitting region including a position overlapping the red light-emitting layer, the green light-emitting layer, and the blue light-emitting layer in a plan view, wherein at least a part of the blue light-emitting layer overlaps the red light-emitting layer and the green light-emitting layer adjacent to the red light-emitting layer in the plan view.

Advantageous Effects of Disclosure

An aspect of the disclosure can achieve a configuration in which the number of layers of the light-emitting device can be reduced, and more background light can be transmitted.

DESCRIPTION OF EMBODIMENTS

First Embodiment

Figure 1:
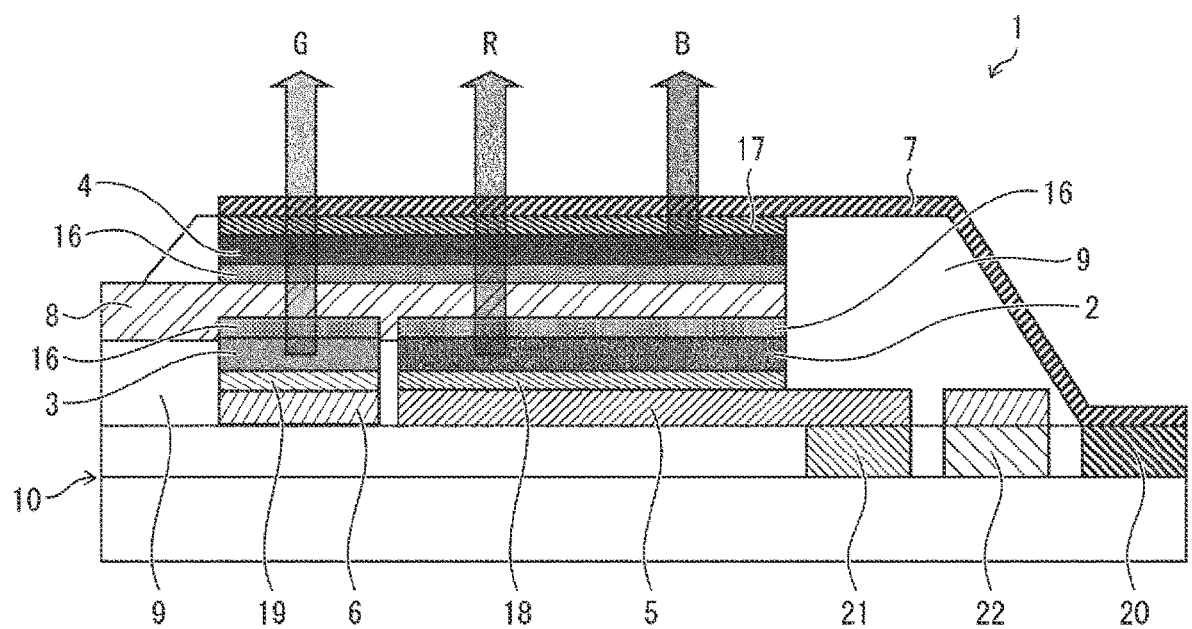
FIG. 1 is a cross-sectional view of a display device according to a first embodiment.
Figure 2:
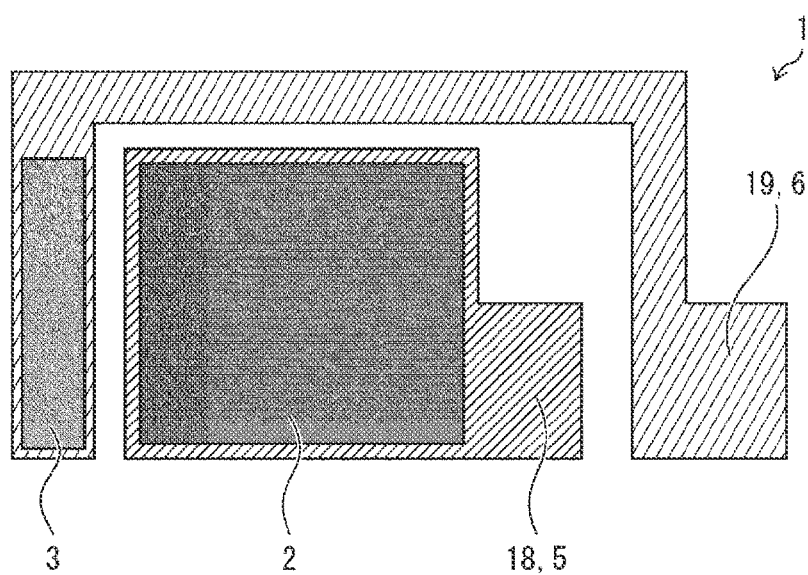
FIG. 2 is a plan view of the display device.

FIG. 1 is a cross-sectional view of a display device 1 according to a first embodiment. FIG. 2 is a plan view of the display device 1. The display device 1 includes a blue light-emitting layer 4 that emits blue light, a red light-emitting layer 2 that is disposed so as to overlap the blue light-emitting layer 4 in a plan view and emits red light, and a green light-emitting layer 3 that is disposed so as to overlap the blue light-emitting layer 4 in the plan view and emits green light. A light-emitting area of the blue light-emitting layer 4 is greater than a light-emitting area of the red light-emitting layer 2, and the light-emitting area of the red light-emitting layer 2 is greater than a light-emitting area of the green light-emitting layer 3. In this way, the light-emitting area of the green light-emitting layer 3 is smaller than the light-emitting area of the blue light-emitting layer 4, and is smaller than the light-emitting area of the red light-emitting layer 2.

In the present specification, the "light-emitting area" means an area of a region of a light-emitting layer from which light is emitted. A pixel covers an edge of an anode electrode or a cathode electrode, an edge cover having an opening exposing the anode electrode or the cathode electrode is provided, and the anode electrode, the light-emitting layer, and the cathode electrode are formed so as to overlap each other in the opening in the region from which light is emitted. The light-emitting area can be determined by, for example, causing light emission from the light-emitting layer and measuring an area of the region from which light is emitted. Further, the light-emitting area described above can also be determined by measuring an area of the region in which the anode electrode, the light-emitting layer, and the cathode electrode overlap each other in the opening. An area of the opening of the edge cover is typically the light-emitting area.

The display device 1 includes a substrate 10. A first thin film transistor (TFT) 21 for controlling light emission of the red light-emitting layer 2, a second thin film transistor 22 for controlling light emission of the green light-emitting layer 3, and a third thin film transistor 20 for controlling light emission of the blue light-emitting layer 4 are formed on the substrate 10. A first electrode 5 corresponding to the red light-emitting layer 2 is formed on the substrate 10 so as to be electrically connected to the first thin film transistor 21, and a second electrode 6 corresponding to the green light-emitting layer 3 is formed on the substrate 10 so as to be electrically connected to the second thin film transistor 22.

The first electrode 5 and the first thin film transistor 21 may be electrically, connected to each other via a lead wiring line (not illustrated). The same also applies to the second electrode 6 and the second thin film transistor 22, and a third electrode 7 and the third thin film transistor 20. A first electron transport layer (ETL) 18 is formed between the first electrode 5 and the red light-emitting layer 2. Then, a second electron transport layer 19 is formed between the second electrode 6 and the green light-emitting layer 3. A partition 9 that insulates the red light-emitting layer 2, the first electron transport layer 18, and the first electrode 5 from the green light-emitting layer 3, the second electron transport layer 19, and the second electrode 6 is formed on the substrate 10. It is preferable that the partition 9 does not have transparency from a perspective of suppressing stray light to an adjacent pixel.

The first electrode 5 and the second electrode 6 function as a cathode, and also function as a reflector when the first electrode 5 and the second electrode 6 are formed of a metal such as aluminum.

A ratio of the light-emitting area of the red light-emitting layer 2, the light-emitting area of the green light-emitting layer 3, and the light-emitting area of the blue light-emitting layer 4 is preferably determined according to a ratio of a luminous efficiency of the red light-emitting layer 2 and a luminosity factor of light from the red light-emitting layer 2, a luminous efficiency of the green light-emitting layer 3 and a luminosity factor of light from the green light-emitting layer 3, and a luminous efficiency of the blue light-emitting layer 4 and a luminosity factor of light from the blue light-emitting layer 4. In this way, the light of the red light-emitting layer 2, the light of the green light-emitting layer 3, and the light of the blue light-emitting layer 4 that are emitted at the same current are equal in luminance. Here, the term "equal" includes a term "substantially equal", and also includes, for example, an error and a fluctuation of approximately ±10% of the luminance of each color of RGB to a degree that white color reproduction when each color of RGB is simultaneously emitted is not affected.

Note that the luminance is the amount acquired by differentiating, by a light-emitting area, a luminous intensity in which a radiation intensity of light radiated from a light-emitting element is weighted by a luminosity factor for each wavelength. The luminosity factor is a standard relative luminosity factor (standard spectral luminous efficiency) with respect to a maximum luminosity factor of a person defined in General Conference of Weights and Measures, and indicates a degree of a sense of brightness of each wavelength by normalizing, to 1, light having a wavelength (555 nm) most strongly sensed by an eye of a person. The luminance can be measured by, for example, a commercial luminance meter.

The ratio is preferably determined according to a ratio of an inverse of a multiplication value of the luminous efficiency of the red light-emitting layer 2 and the luminosity factor of the light from the red light-emitting layer 2, an inverse of a multiplication value of the luminous efficiency of the green light-emitting layer 3 and the luminosity factor of the light from the green light-emitting layer 3, and an inverse of a multiplication value of the luminous efficiency of the blue light-emitting layer 4 and the luminosity factor of the light from the blue light-emitting layer 4. In this way, the light of the red light-emitting layer 2, the light of the green light-emitting layer 3, and the light of the blue light-emitting layer 4 that are emitted at the same current are equal in luminance, and a drive circuit and a color reproduction algorithm can be simplified.

The light-emitting area of the green light-emitting layer 3 is preferably less than one-tenth of the light-emitting area of the blue light-emitting layer 4. In this way, the light of the green light-emitting layer 3 and the light of the blue light-emitting layer 4 that are emitted at the same current are equal in luminance.

It is preferable that, in the plan view, the entire red light-emitting layer 2 and a part of the blue light-emitting layer 4 are disposed so as to overlap each other, and the entire green light-emitting layer 3 and a part of the blue light-emitting layer 4 are disposed so as to overlap each other. In this way, the red light-emitting layer 2 and the blue light-emitting layer 4 are layered, and the green light-emitting layer 3 and the blue light-emitting layer 4 are layered, and thus red light emission, green light emission, and blue light emission can be achieved in a projection area of the blue light-emitting layer 4.

The red light-emitting layer 2 and the green light-emitting layer 3 are preferably disposed so as not to overlap each other in the plan view. In this way, two layers of the red light-emitting layer 2 and the green light-emitting layer 3, and the blue light-emitting layer 4 are substantially layered, and thus the display device 1 can be thinner than a configuration in which three layers of the red light-emitting layer 2, the green light-emitting layer 3, and the blue light-emitting layer 4 are layered.

A common electrode 8 having first polarity and being electrically connected to all of the red light-emitting layer 2, the green light-emitting layer 3, and the blue light-emitting layer 4 is formed so as to be sandwiched between the blue light-emitting layer 4, and the red light-emitting layer 2 and the green light-emitting layer 3. The first polarity is polarity as an anode (anode electrode) or polarity as a cathode (cathode electrode). In the present embodiment, the first polarity has the polarity as the anode, and the common electrode 8 is transparent and has the polarity as the anode.

A common hole transport layer (HTL) 16 is formed between the common electrode 8 and the blue light-emitting layer 4, and between the common electrode 8, and the red light-emitting layer 2 and the green light-emitting layer 3.

The first electrode 5 has second polarity opposite to the first polarity, and is electrically connected to the red light-emitting layer 2. The second electrode 6 has the second polarity, and is electrically connected to the green light-emitting layer 3. Note that, when the first polarity is the polarity of the anode, the second polarity is the polarity of the cathode, and when the first polarity is the polarity of the cathode, the second polarity is the polarity of the anode. In the present embodiment, the second polarity is the polarity of the cathode.

Note that, in the present embodiment, an example in which the common electrode 8 is the anode, and the first electrode 5 and the second electrode 6 are the cathode has been described, but the disclosure is not limited thereto. Conversely, even when the common electrode 8 is the cathode, and the first electrode 5 and the second electrode 6 are the anode, an effect of the present embodiment can be obtained. Note that, when the common electrode 8 is the anode, and the first electrode 5 and the second electrode 6 are the cathode, the common electrode 8 and the common hole transport layer 16 can be made common, and thus a manufacturing procedure becomes simplified.

A third electron transport layer 17 is formed on the blue light-emitting layer 4. The third electrode 7 having the second polarity and being electrically connected to the blue light-emitting layer 4 via the third electron transport layer 17 is formed on the third electron transport layer 17 and formed so as to be electrically connected to the third thin film transistor 20.

The third electrode 7 functions as the cathode. The common hole transport layer 16, the third electron transport layer 17, and the third electrode 7 are transparent.

In this way, each of the first electrode 5 and the second electrode 6 is provided on an opposite side to the common electrode 8 with respect to the red light-emitting layer 2 and the green light-emitting layer 3, and the third electrode 7 is provided on an opposite side to the common electrode 8 with respect to the blue light-emitting layer 4. Then, the first electrode 5 and the second electrode 6 are formed of the same material and formed in the same layer. In other words, the first electrode 5 and the second electrode 6 are formed by performing patterning after one or more layers of a conductive film (including aluminum, silver, transparent conductive film, or the like) are formed as a film. The first electrode 5 and the second electrode 6 can be formed of, for example, a metal such as aluminum.

As illustrated in FIG. 1, it is preferable that the red light-emitting layer 2 and the green light-emitting layer 3 that emit light having a longer wavelength are disposed on the substrate 10 side, and the blue light-emitting layer 4 that emits light having a shorter wavelength is disposed on a surface side of the display device 1. Conversely, in a case of a configuration in which the blue light-emitting layer 4 is disposed on the substrate 10 side, and the red light-emitting layer 2 and the green light-emitting layer 3 are disposed on the surface side of the display device 1, the blue light emitted from the blue light-emitting layer 4 is absorbed by the red light-emitting layer 2 and the green light-emitting layer 3, and it is difficult for the blue light to be suitably emitted from the display device 1.

In the present embodiment, a ratio among a projection area of the red light-emitting layer 2, a projection area of the green light-emitting layer 3, and the projection area of the blue light-emitting layer 4 is determined based on the luminous efficiency of the red light-emitting layer 2, the green light-emitting layer 3, and the blue light-emitting layer 4, and the luminosity factor of the red light from the red light-emitting layer 2, the green light from the green light-emitting layer 3, and the blue light from the blue light-emitting layer 4 such that the red light from the red light-emitting layer 2, the green light from the green light-emitting layer 3, and the blue light from the blue light-emitting layer 4 are equal in luminance.

The luminous efficiency includes external quantum efficiency (EQE), or photoluminescence quantum yield (PLAY).

The luminosity factor is a constant determined based on a wavelength of light. The external quantum efficiency or the photoluminescence quantum yield is a constant that mainly depends on a material of the light-emitting layer, and is a constant that can be estimated before the display device 1 is manufactured. When the luminous efficiency, includes the photoluminescence quantum yield, area usage efficiency of each light-emitting layer is improved. When the luminous efficiency includes the external quantum efficiency, the luminous efficiency of each light-emitting layer is improved.

As shown in Table 1 below, the projection area of each color pixel of the red light-emitting layer 2, the green light-emitting layer 3, and the blue light-emitting layer 4 is changed in proportion to (1/(luminous efficiency (QY)× luminosity factor)). In this way, when the same current flows through a pixel of each color of the red light-emitting layer 2, the green light-emitting layer 3, and the blue light-emitting layer 4, the luminance of light emission from the red light-emitting layer 2, the green light-emitting layer 3, and the blue light-emitting layer 4 is identical to each other.

TABLE 1

| COLOR | QY [%] | RELATIVE VALUE | LUMINOSITY FACTOR | EML AREA | SIZE |
|---|---|---|---|---|---|
| B | 65 | 0.8 | 0.1 | 10.3 | 3.2 |
| G | 80 | 1.0 | 1.0 | 1.0 | 1.0 |
| R | 90 | 1.1 | 0.1 | 8.9 | 3.0 |

Table 1 shows the luminous efficiency (QY), the luminosity factor, and a pixel size of the red light-emitting layer 2, the green light-emitting layer 3, and the blue light-emitting layer 4. All numerical values shown in Table 1 are numerical values with reference to green (G). More specifically, external quantum efficiency (EQE) is used instead of quantum efficiency (QY) as the luminous efficiency. The projection area of each pixel of the red light-emitting layer 2, the green light-emitting layer 3, and the blue light-emitting layer 4 is determined so as to be in proportion to (1/(luminous efficiency×luminosity factor)).

In this way, by changing the projection area of the pixel of each color of the red light-emitting layer 2, the green light-emitting layer 3, and the blue light-emitting layer 4 based on the luminous efficiency and the luminosity factor, the luminance having the same brightness can be obtained from the red light-emitting layer 2, the green light-emitting layer 3, and the blue light-emitting layer 4 with the same current flowing through the red light-emitting layer 2, the green light-emitting layer 3, and the blue light-emitting layer 4.

Further, a drive circuit and a drive algorithm of the red light-emitting layer 2, the green light-emitting layer 3, and the blue light-emitting layer 4 can be made common to be simplified by making the red light-emitting layer 2, the green light-emitting layer 3, and the blue light-emitting layer 4 equal in current-luminance characteristics in such a manner.

Further, the red light-emitting layer 2 and the green light-emitting layer 3 can be contained within a pixel area of the blue light-emitting layer 4 by changing the projection area of the pixel of the red light-emitting layer 2, the green light-emitting layer 3, and the blue light-emitting layer 4 in such a manner. As a result, a tandem structure can be achieved by layering only two layers of the blue light-emitting layer 4, and the red light-emitting layer 2 and the green light-emitting layer 3.

The blue light-emitting layer 4, and the red light-emitting layer 2 and the green light-emitting layer 3 are symmetrically vertically disposed with respect to the common electrode 8 and the common hole transport layer 16, and thus three layers of the red light-emitting layer 2, the green light-emitting layer 3, and the blue light-emitting layer 4 can be simplified to two layers to be layered, and a manufacturing cost and man-hours of a tandem structure of an organic EL element can be reduced.

Furthermore, when the first electrode 5 and the second electrode 6 wired to the red light-emitting layer 2 and the green light-emitting layer 3 being a lower layer of the blue light-emitting layer 4 are layered in two layers, an area needed for wiring can be reduced.

As described above, a layering type light-emitting element having a small pixel size can be achieved in the number of layers smaller than that in the related art, and a high-resolution display and a compact display can be manufactured at a low cost.

In the present embodiment, the light-emitting area of each color of the red light-emitting layer 2, the green light-emitting layer 3, and the blue light-emitting layer 4 is (light-emitting area of blue light-emitting layer 4)≥((light-emitting area of red light-emitting layer 2)+(light-emitting area of green light-emitting layer 3)). This, the red light-emitting layer 2 and the green light-emitting layer 3 can be contained within the projection area of the blue light-emitting layer 4.

A quantum dot used in the light-emitting layer indicates a characteristic in which light having a wavelength shorter than a light emission wavelength of the quantum dot is absorbed, and a carrier optically excited in the quantum dot is recombined to emit light. The light emission is referred to as photoexcitation light emission. Due to a property of the photoexcitation light emission, the light from the blue light-emitting layer 4 is absorbed by the green light-emitting layer 3 and the red light-emitting layer 2, and photoexcitation light emission is performed in the corresponding colors. Further, the light from the green light-emitting layer 3 is absorbed by the red light-emitting layer 2, and photoexcitation light emission is performed. Such photoexcitation light emission may cause an unintended fluctuation in luminance and a hue change, which is not thus preferable.

In order to prevent the photoexcitation light emission on a light extraction surface side, the blue light-emitting layer 4 is disposed on an uppermost portion, the red light-emitting layer 2 and the green light-emitting layer 3 are disposed lower than the blue light-emitting layer 4, and the common electrode 8 serving as a common anode and the common hole transport layer 16 are disposed between the blue light-emitting layer 4, and the red light-emitting layer 2 and the green light-emitting layer 3. According to the configuration, the anode and the hole transport layer (HTL) needed for each color of the red light-emitting layer 2, the green light-emitting layer 3, and the blue light-emitting layer 4 in a known layered structure are made common to all the colors of the red light-emitting layer 2, the green light-emitting layer 3, and the blue light-emitting layer 4. Thus, a layered structure is more simplified than the known layered structure.

The first electrode 5 having reflectivity and the first electron transport layer 18 are disposed in a lower layer of the red light-emitting layer 2. The second electrode 6 having reflectivity and the second electron transport layer 19 are disposed in a lower layer of the green light-emitting layer 3.

The blue light-emitting layer 4 shares the common electrode 8 with the red light-emitting layer 2 and the green light-emitting layer 3. Then, the third electron transport layer 17 having transparency and the third electrode 7 having transparency are layered in this order above the blue light-emitting layer 4.

The partition 9 is provided in an appropriate shape between and around the layers of the red light-emitting layer 2, the green light-emitting layer 3, and the blue light-emitting layer 4 for insulating and wiring the layers of the red light-emitting layer 2, the green light-emitting layer 3, and the blue light-emitting layer 4. In a known structure, a partition serving as an insulating layer needs to be provided around each pixel for insulating the periphery of each pixel of red, green, and blue disposed on a plane. However, in the present embodiment, the red light-emitting layer 2 and the green light-emitting layer 3, and the blue light-emitting layer 4 are layered in the light-emitting area of the blue light-emitting layer 4, and thus only the periphery corresponding to one pixel in the known structure may be insulated. Thus, the amount of a material of the partition 9 needed for insulation may be reduced to approximately one-third of the known layered configuration.

Each electrode of the first electrode 5, the second electrode 6, the third electrode 7, and the common electrode 8, each electron transport layer of the third electron transport layer 17, the first electron transport layer 18, and the second electron transport layer 19, the common hole transport layer 16, and the partition 9 can be formed by using a material typically used for an organic light emitting diode (OLED) and a quantum dot light emitting diode (QLED). It is preferable that the partition 9 does not have transparency from the perspective of suppressing stray light to an adjacent pixel.

As illustrated in FIG. 2, in the plan view, the second electrode 6 does not overlap the first electrode 5, is formed so as to surround the first electrode 5 spaced from the first electrode 5, and is electrically connected to the green light-emitting layer 3 via the second electron transport layer 19.

FIG. 3(a) is a plan view of a modified example of the second electrode 6 provided in the display device 1, and FIG. 3(b) is a cross-sectional view taken along a plane AA illustrated in FIG. 3(a). Constituent elements similar to the constituent elements described above are given the same reference numerals, and detailed descriptions thereof are not repeated.

In the plan view, the first electrode 5 and the second electrode 6 may be disposed so as to overlap each other. In other words, as illustrated in FIGS. 3(a) and (b), the second electrode 6 and the second electron transport layer 19 may be formed so as to be joined to the green light-emitting layer 3 through a lower side of the red light-emitting layer 2, the first electron transport layer 18, the first electrode 5, and the partition 9.

Figure 3:
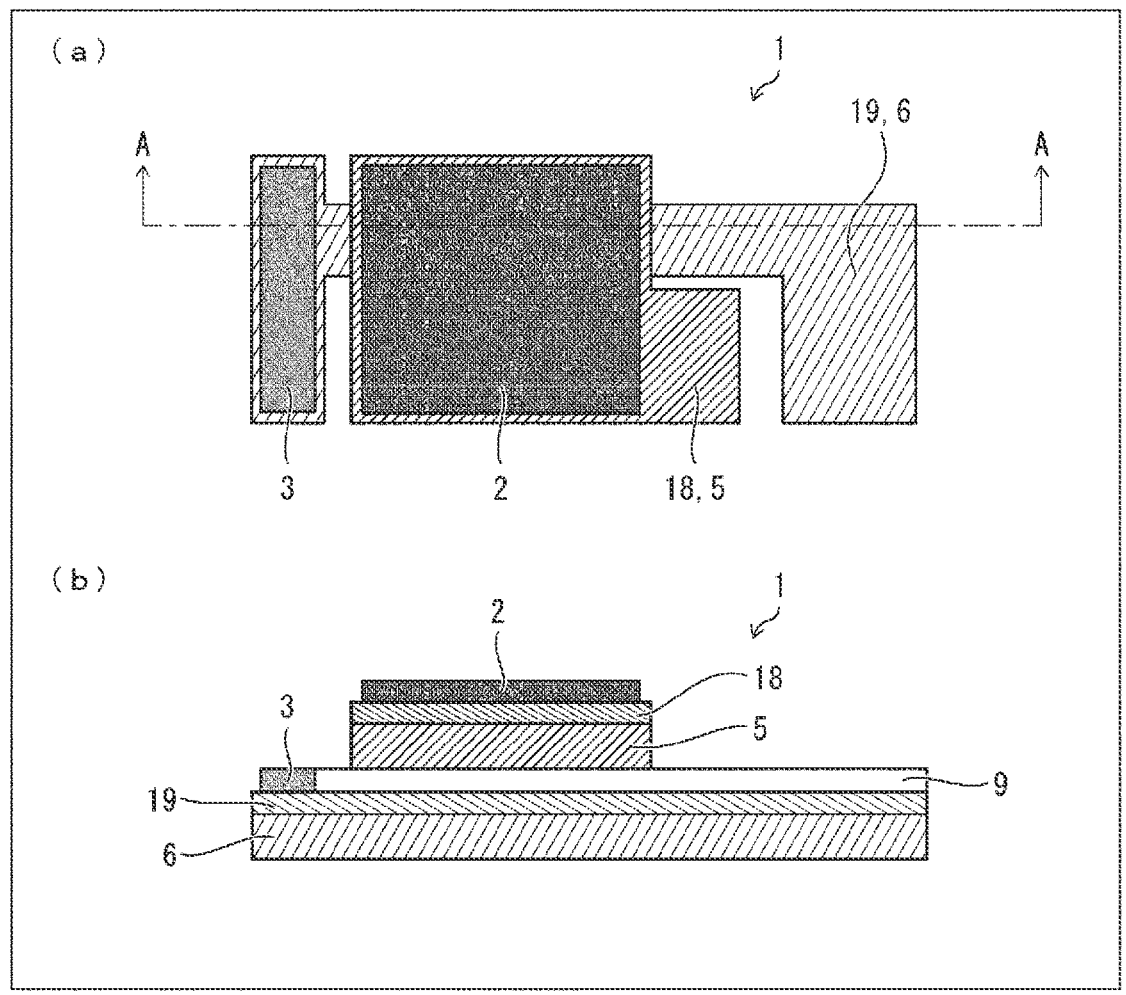
FIG. 3($a$) is a plan view of a modified example of a second electrode provided on the display device, and FIG. 3($b$) is a cross-sectional view of the modified example.

FIGS. 2 and 3 illustrate that the first electrode 5 connects the red light-emitting layer 2 being the lowest layer to the first thin film transistor 21, and the second electrode 6 connects the green light-emitting layer 3 being the lowest layer to the second thin film transistor 22. FIG. 2 illustrates an example in which the first electrode 5 being a wiring line related to the red light-emitting layer 2 and the second electrode 6 being a wiring line related to the green light-emitting layer 3 are disposed in a surface of the substrate 10. FIG. 3 illustrates an example in which the first electrode 5 being a wiring line related to the red light-emitting layer 2 is layered above the second electrode 6 being a wiring line related to the green light-emitting layer 3 via the partition 9 being an insulating layer.

Although the example illustrated in FIG. 2 needs an area acquired by simply adding an area corresponding to the wiring line of the first electrode 5 and an area corresponding to the wiring line of the second electrode 6, the layered structure can be simplified.

Although the example illustrated in FIG. 3 needs the extra partition 9 serving as the insulating layer since the second electrode 6 and the first electrode 5 are layered, a wiring line area acquired by adding an area corresponding to the wiring line of the first electrode 5 and an area corresponding to the wiring line of the second electrode 6 can be reduced by an area in which the first electrode 5 and the second electrode 6 overlap each other.

Next, an example of a manufacturing method for the display device 1 is exemplified. FIGS. 4(a) to (d) are cross-sectional views illustrating the manufacturing method for the display device 1. Constituent elements similar to the constituent elements described above are given the same reference numerals, and detailed descriptions thereof are not repeated.

Figure 4:
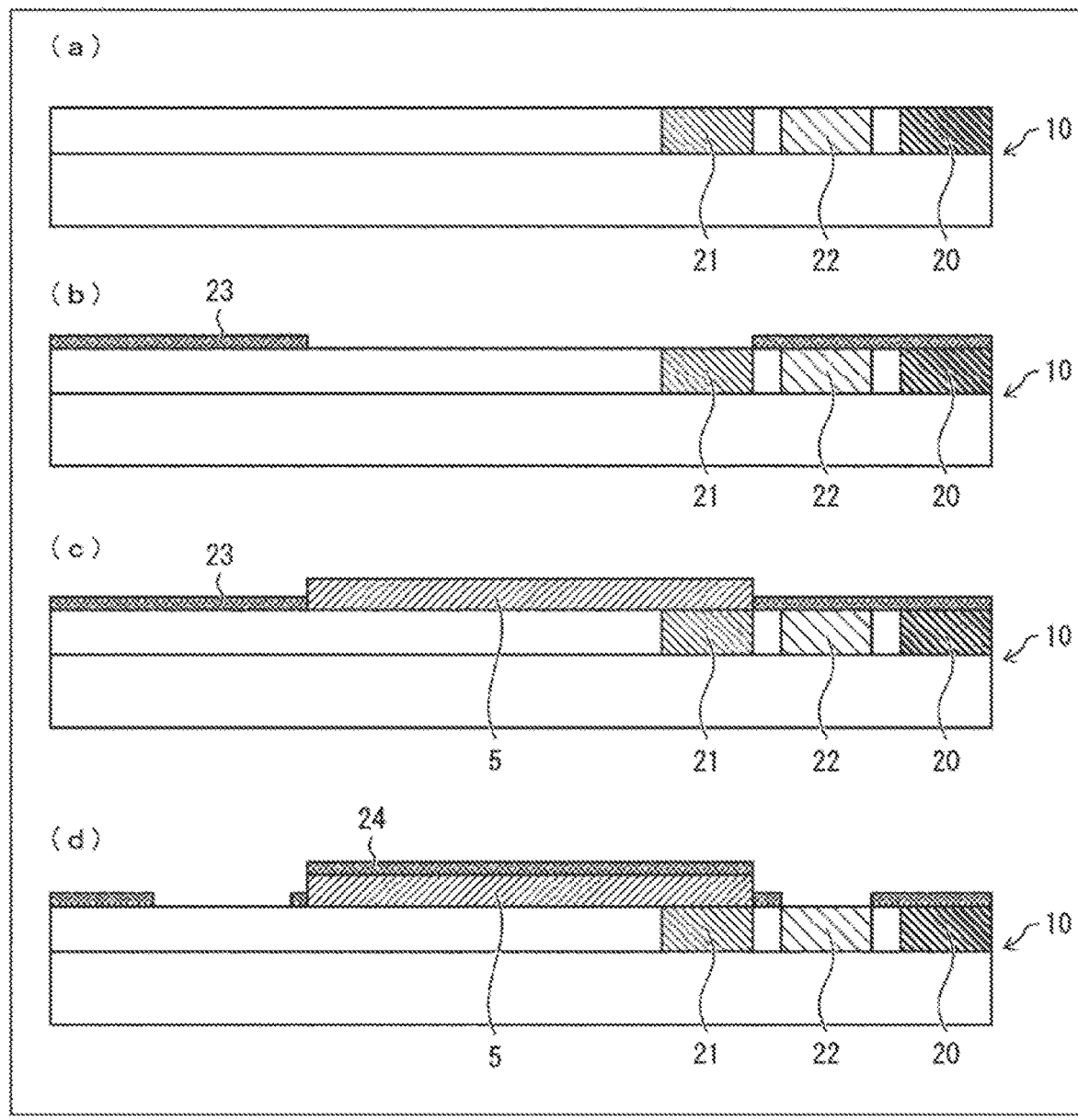
FIGS. 4($a$) to ($d$) are cross-sectional views illustrating a manufacturing method for the display device.

A known thin film transistor preparation step, a known wiring line material, and a known mask can be used in the manufacturing method for the display device 1. In order to prepare the display device 1 according to the present embodiment, first, as illustrated in FIG. 4(b), a mask 23 for forming the first electrode 5 is formed on the leveled substrate 10 on which the first thin film transistor 21, the second thin film transistor 22, and the third thin film transistor 20 illustrated in FIG. 4(a) are formed. The mask 23 is a photomask by photolithography using a metal mask or a photoresist.

Then, as illustrated in FIG. 4(c), the first electrode 5 to become a cathode wiring line to the red light-emitting layer 2 is formed by a means such as sputtering, vapor deposition, and application. Next, the mask 23 is removed from the substrate 10, and, as illustrated in FIG. 4(d), a mask 24 for forming the second electrode 6 to become a cathode wiring line to the green light-emitting layer 3 is then formed.

FIGS. 5(a) to (d) are cross-sectional views illustrating the manufacturing method for the display device 1. Constituent elements similar to the constituent elements described above are given the same reference numerals, and detailed descriptions thereof are not repeated.

Figure 5:
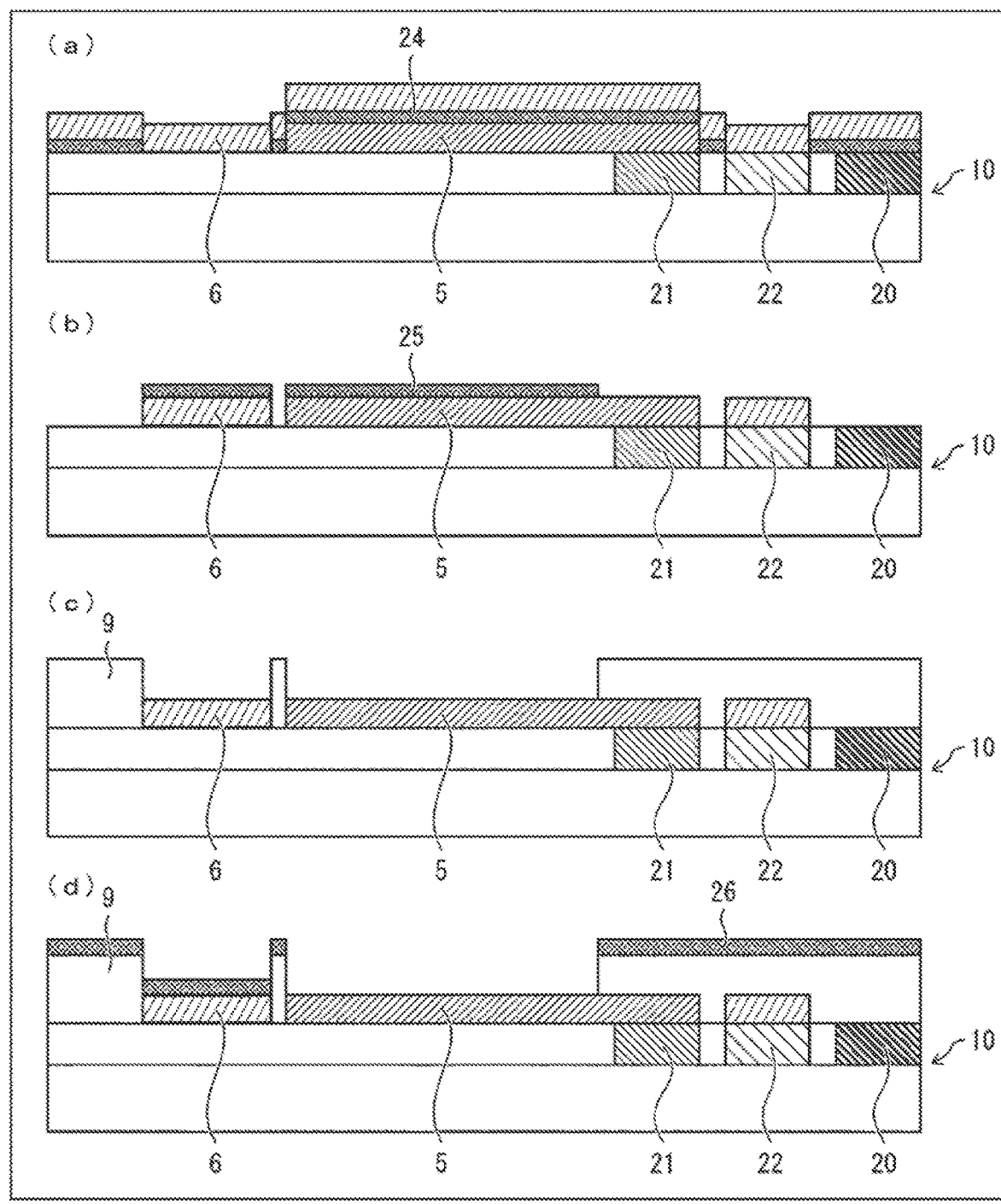
FIGS. 5($a$) to ($d$) are cross-sectional views illustrating the manufacturing method for the display device.

Subsequently, as illustrated in FIG. 5(a), the second electrode 6 to become the cathode wiring line to the green light-emitting layer 3 is formed by using the mask 24 by a means similar to that above such as sputtering, vapor deposition, and application.

Then, the mask 24 is removed, and, as illustrated in FIG. 5(b), a mask 25 for forming the partition 9 is formed on the first electrode 5 and the second electrode 6. Next, as illustrated in FIG. 5(c), after the partition 9 is formed by the mask 25, the mask 25 is removed. Note that, as another means for forming the partition 9, a partition material may be applied to the entire surface of the substrate 10, and ashing or etching may be performed on an area unnecessary to form the partition 9 via the mask 25. Subsequently, as illustrated in FIG. 5(d), a mask 26 open in a region for forming the red light-emitting layer 2 is formed.

Figure 6:
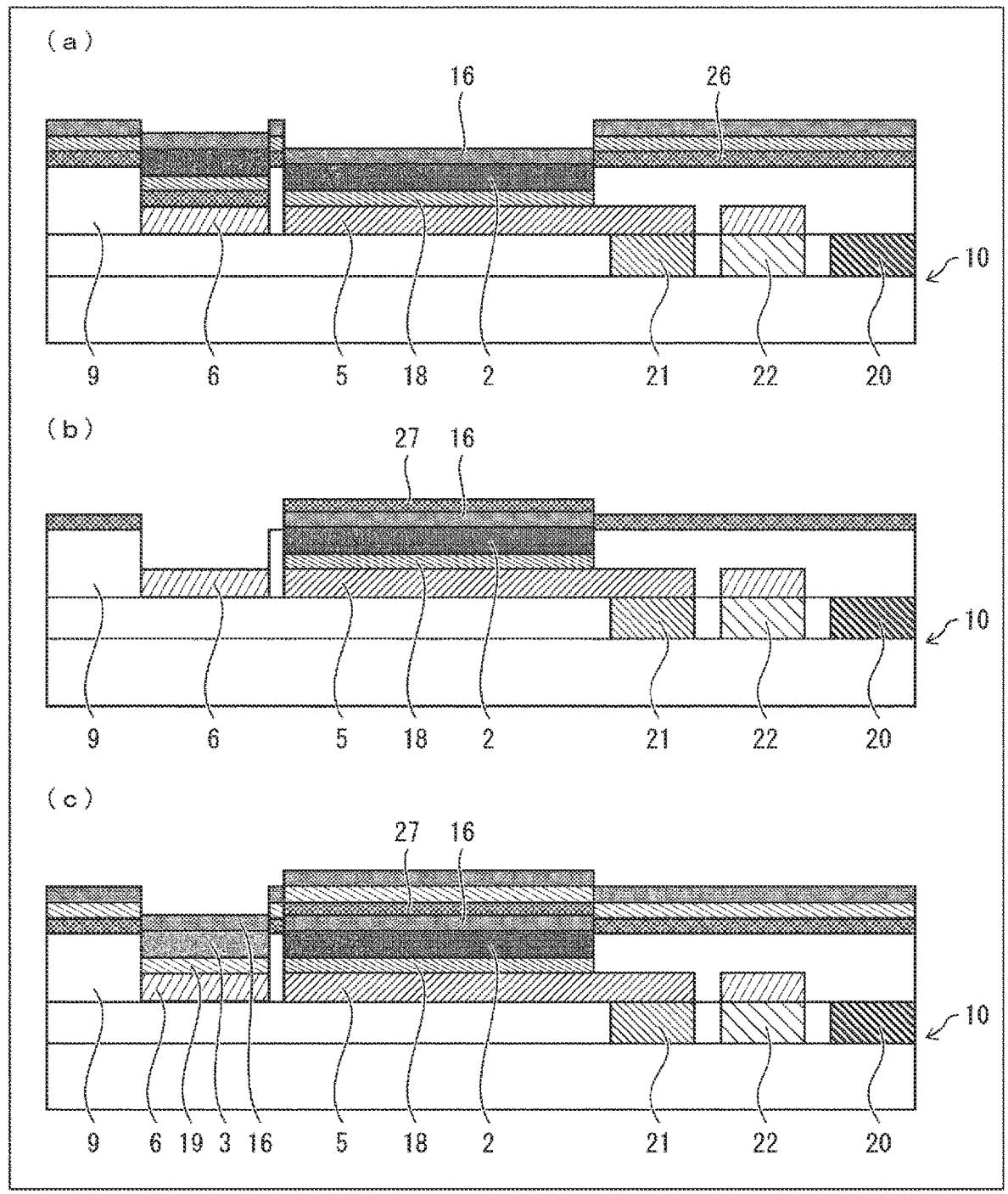
FIGS. 6($a$) to ($c$) are cross-sectional views illustrating the manufacturing method for the display device.

FIGS. 6(a) to (c) are cross-sectional views illustrating the manufacturing method for the display device 1. Constituent elements similar to the constituent elements described above are given the same reference numerals, and detailed descriptions thereof are not repeated.

Then, a first electron transport layer 18 is formed on the first electrode 5 by a means similar to that above such as sputtering, vapor deposition, and application, Next, while using the same mask 26, the red light-emitting layer 2 and the common hole transport layer 16 are formed on the first electron transport layer 18 so as to be layered in this order. In a case of the QLED, the red light-emitting layer 2 can be formed by using colloidal solution application, printing by ink-jet and the like, or a transfer method. In a case of the OLED, the red light-emitting layer 2 can be formed by using printing or vapor deposition. The common hole transport layer 16 is formed by a means similar to the means for forming the first electron transport layer 18.

Subsequently, as illustrated in FIG. 6(b), the mask 26 is removed and replaced with a mask 27 for the green light-emitting layer 3, Then, as illustrated in FIG. 6(c), the second electron transport layer 19, the green light-emitting layer 3, and the common hole transport layer 16 are formed on the second electrode 6 so as to be layered in this order. At this time; the common hole transport layer 16 formed on the red light-emitting layer 2 serves a function of protecting the red light-emitting layer 2 from process damage by a solvent for a photomask.

Figure 7:
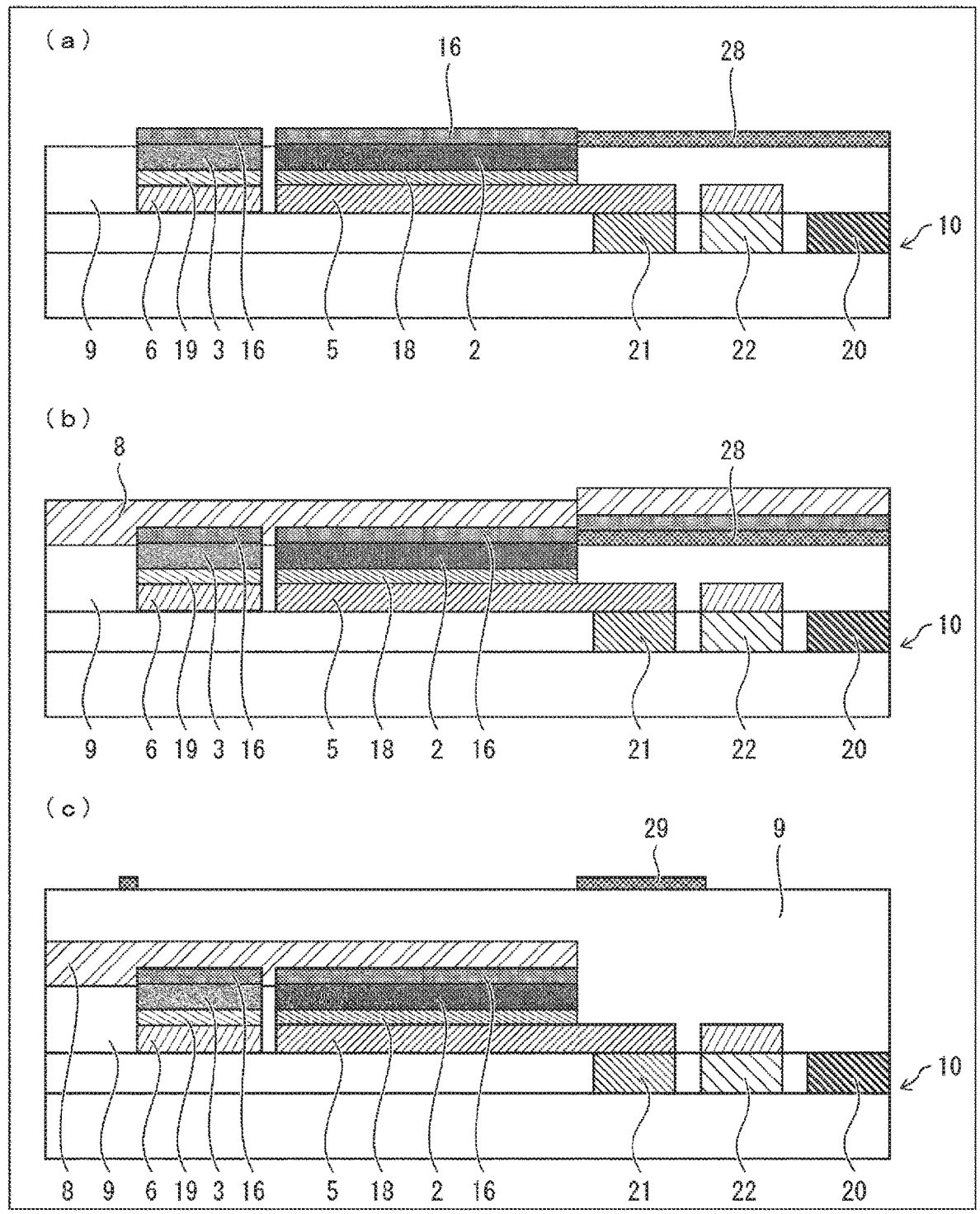
FIGS. 7($a$) to (c are cross-sectional views illustrating the manufacturing method for the display device.

FIGS. 7(a) to (c) are cross-sectional views illustrating the manufacturing method for the display device 1. Constituent elements similar to the constituent elements described above are given the same reference numerals, and detailed descriptions thereof are not repeated.

Next, as illustrated in FIG. 7(a), the mask 27 is removed and replaced with a mask 28 for forming the common electrode 8 to become a common anode. Subsequently, the common electrode 8 is formed as illustrated in FIG. 7(b). Then, as illustrated in FIG. 7(c), the mask 28 is removed, and the entire surface of the substrate 10 is covered with the partition 9. Next, a mask 29 is formed on a surface of the partition 9.

Figure 8:
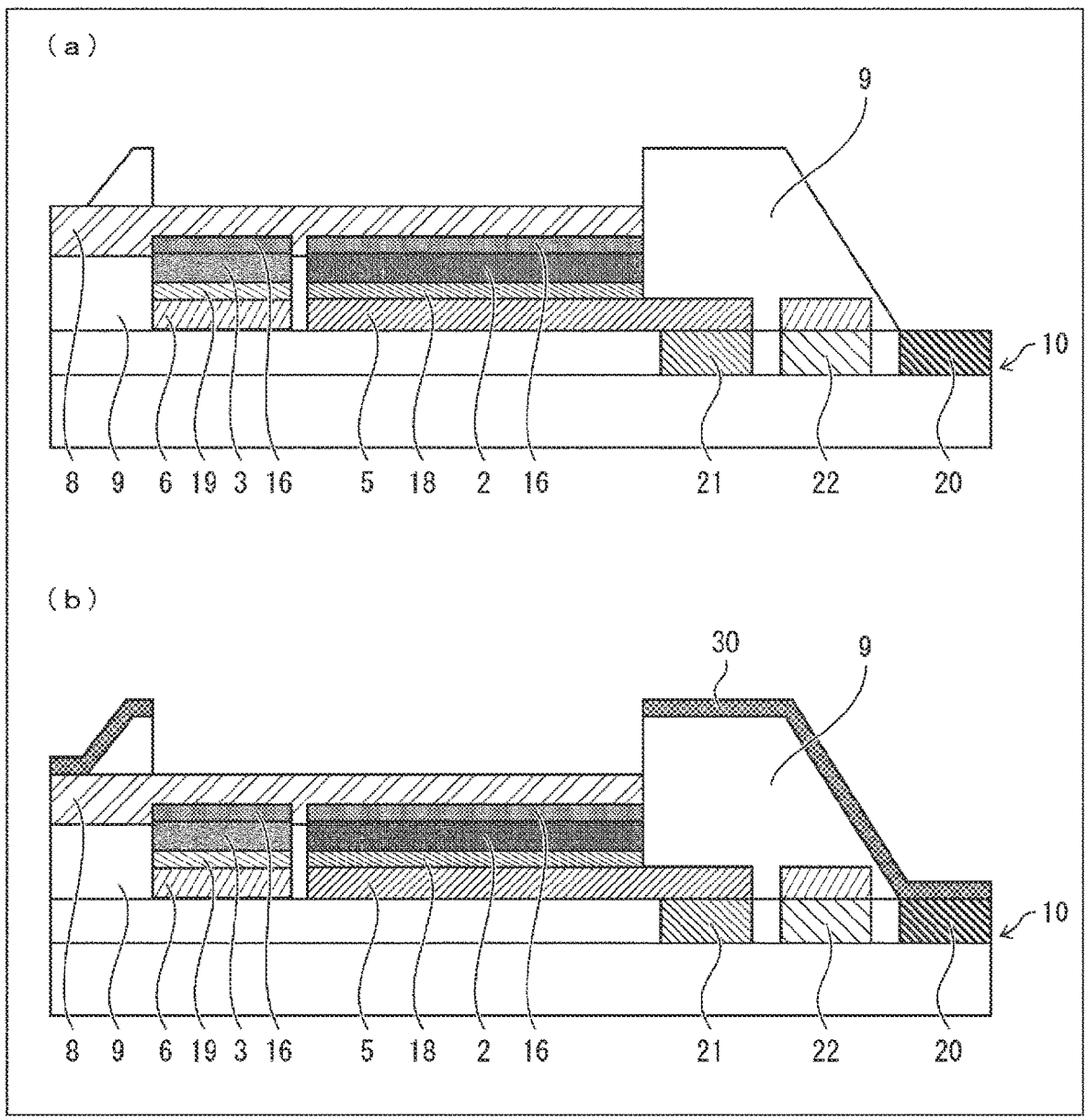
FIGS. 8($a$) and ($b$) are cross-sectional views illustrating the manufacturing method for the display device.

FIGS. 8(a) and (b) are cross-sectional views illustrating the manufacturing method for the display device 1. Constituent elements similar to the constituent elements described above are given the same reference numerals, and detailed descriptions thereof are not repeated.

Then, as illustrated in FIG. 8(a), after aching or etching is performed on the surface of the partition 9, the mask 29 is removed. Next, as illustrated in FIG. 8(b), a mask 30 for the blue light-emitting layer 4 is formed.

Figure 9:
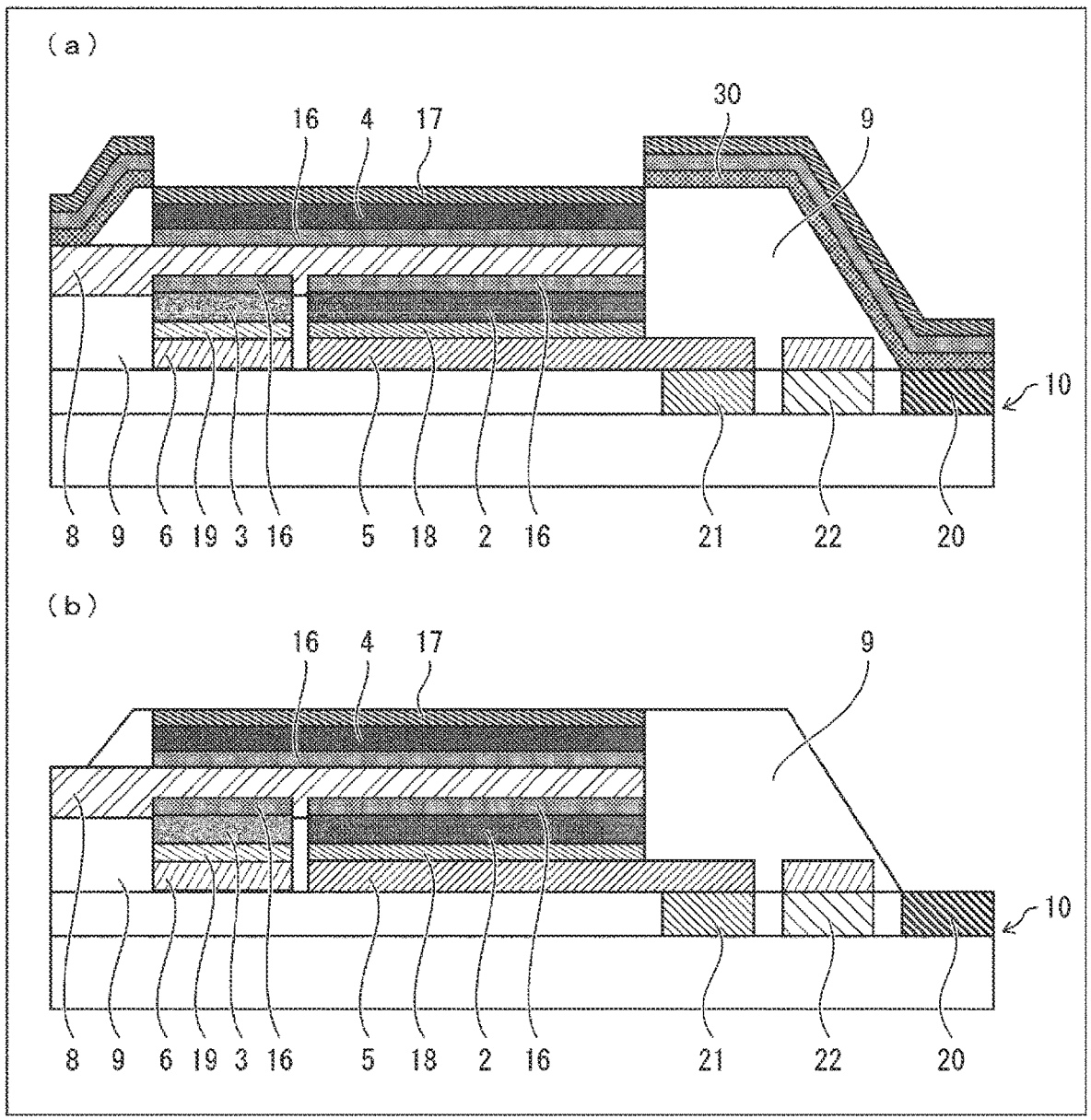
FIGS. 9($a$) and ($b$) are cross-sectional views illustrating the manufacturing method for the display device.

FIGS. 9(a) and (b) are cross-sectional views illustrating the manufacturing method for the display device 1. Subsequently, as illustrated in FIG. 9(a), the common hole transport layer 16, the blue light-emitting layer 4, and the third electron transport layer 17 are formed on the common electrode 8 so as to be layered in this order. Then, as illustrated in FIG. 9(b), the mask 30 is removed.

FIGS. 10(a) and (b) are cross-sectional views illustrating the manufacturing method for the display device 1. Next, as illustrated in FIG. 10(a), the third electrode 7 to become the cathode of the blue light-emitting layer 4 is formed via a mask 31. Subsequently, as illustrated in FIG. 10(b), the mask 31 is removed, and an element structure of the display device 1 is completed. Then, the common electrode 8 to become an exposed common anode and the substrate 10 are wired, the entire panel is sealed, and the display device 1 is completed.

The masks 23 to 31 described above are photomasks by photolithography using a metal mask or a photoresist. Further, the partition 9 can be formed of, for example, a resin material. Processing of the resin material is performed by using aching or dry etching.

Note that an example in which the blue light-emitting layer 4 is layered on the red light-emitting layer 2 and the green light-emitting layer 3, and the anode is made common to the red light-emitting layer 2, the green light-emitting layer 3, and the blue light-emitting layer 4 by the common electrode 8 is described, but the disclosure is not limited thereto. Conversely, the red light-emitting layer 2 and the green light-emitting layer 3 may be layered on the blue light-emitting layer 4, and the cathode may be made common to the red light-emitting layer 2, the green light-emitting layer 3, and the blue light-emitting layer 4. In the OLED, the blue light-emitting layer 4 can be disposed on the substrate 10 side with respect to the red light-emitting layer 2 and the green light-emitting layer 3 in such a manner. The same can also apply to the QLED.

Since the common electrode 8 and the common hole transport layer 16 can be made common when the anode is made common as compared to when the cathode disposed on an electron transport layer side is made common, it is easy and preferable in terms of a simplified manufacturing procedure.

Further, an example in which the first electrode 5 and the second electrode 6 have the reflectivity is exemplified, but the first electrode 5 and the second electrode 6 may be formed to be transparent similarly to the third electrode 7, and the display device may be a transparent display type.

Second Embodiment

Figure 11:
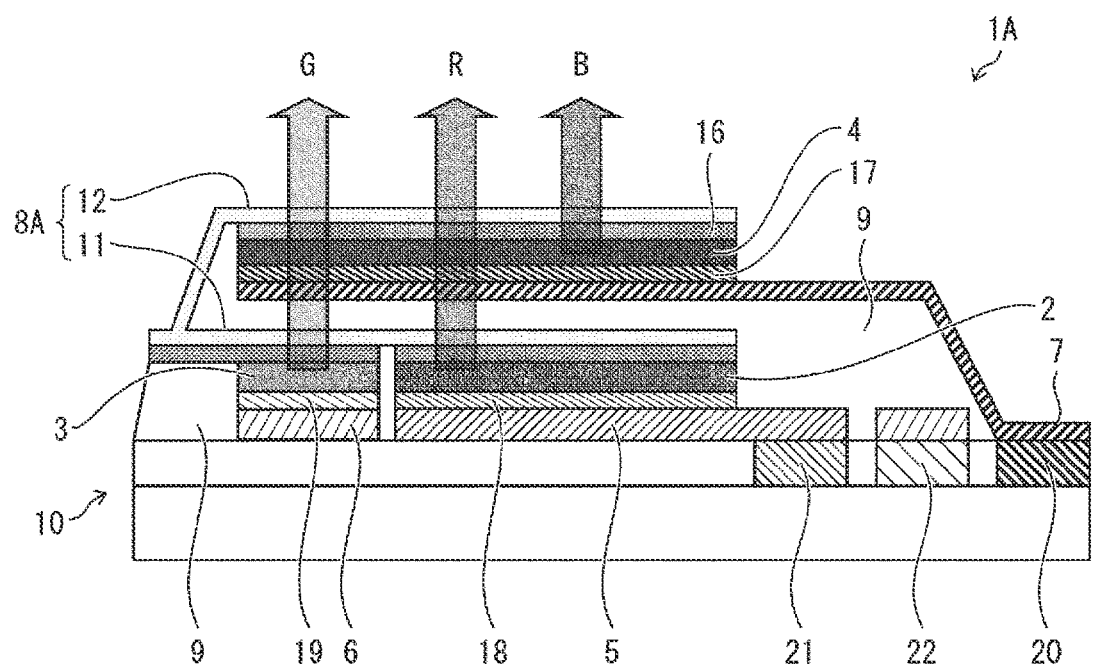
FIG. 11 is a cross-sectional view of a display device according to a second embodiment.

FIG. 11 is a cross-sectional view of a display device 1A according to a second embodiment. Constituent elements similar to the constituent elements described above are given the same reference numerals, and detailed descriptions thereof are not repeated.

The display device 1A has another structure in which a blue light-emitting layer 4, and a red light-emitting layer 2 and a green light-emitting layer 3 are layered, and a point different from the display device 1 according to the first embodiment is a point that the display device 1A includes a common electrode SA. The common electrode SA includes a first common electrode portion 11 provided between the red light-emitting layer 2 and the green light-emitting layer 3, and the blue light-emitting layer 4 in order to be electrically, connected to the red light-emitting layer 2 and the green light-emitting layer 3, and a second common electrode portion 12 provided on an opposite side to the red light-emitting layer 2 and the green light-emitting layer 3 with respect to the blue light-emitting layer 4 in order to be electrically connected to the blue light-emitting layer 4.

A portion of a partition 9 between the blue light-emitting layer 4, and the red light-emitting layer 2 and the green light-emitting layer 3 has transparency. Similarly to the first embodiment, it is preferable that the portion of the partition 9 between the red light-emitting layer 2 and the green light-emitting layer 3 does not have transparency from the perspective of suppressing stray light to an adjacent pixel.

Similarly to the display device 1 according to the first embodiment, the display device 1A according to the second embodiment can also be manufactured by using a known thin film transistor preparation step, a known wiring line material, and a known mask.

The display device 1A according to the second embodiment is manufactured by a manufacturing method including: a first electrode formation step of forming, on a substrate 10, a first electrode 5 for being electrically connected to the red light-emitting layer 2; a second electrode formation step of forming, on the substrate 10, a second electrode 6 for being electrically connected to the green light-emitting layer a red light-emitting layer formation step of forming the red light-emitting layer 2 on the first electrode 5; a green light-emitting layer formation step of forming the green light-emitting layer 3 on the second electrode 6; a first common electrode formation step of forming, on the red light-emitting layer 2 and the green light-emitting layer 3, the first common electrode portion 11 common to the red light-emitting layer 2 and the green light-emitting layer 3; a third electrode formation step of forming, on the first common electrode portion 11, a third electrode 7 for being electrically connected to the blue light-emitting layer 4; a blue light-emitting layer formation step of forming the blue light-emitting layer 4 on the third electrode 7; and a second common electrode formation step of forming the second common electrode portion 12 for being electrically connected to the blue light-emitting layer 4. A light-emitting area of the blue light-emitting layer 4 is greater than a light-emitting area of the red light-emitting layer 2, and the light-emitting area of the red light-emitting layer 2 is greater than a light-emitting area of the green light-emitting layer 3.

Third Embodiment

Figure 12:
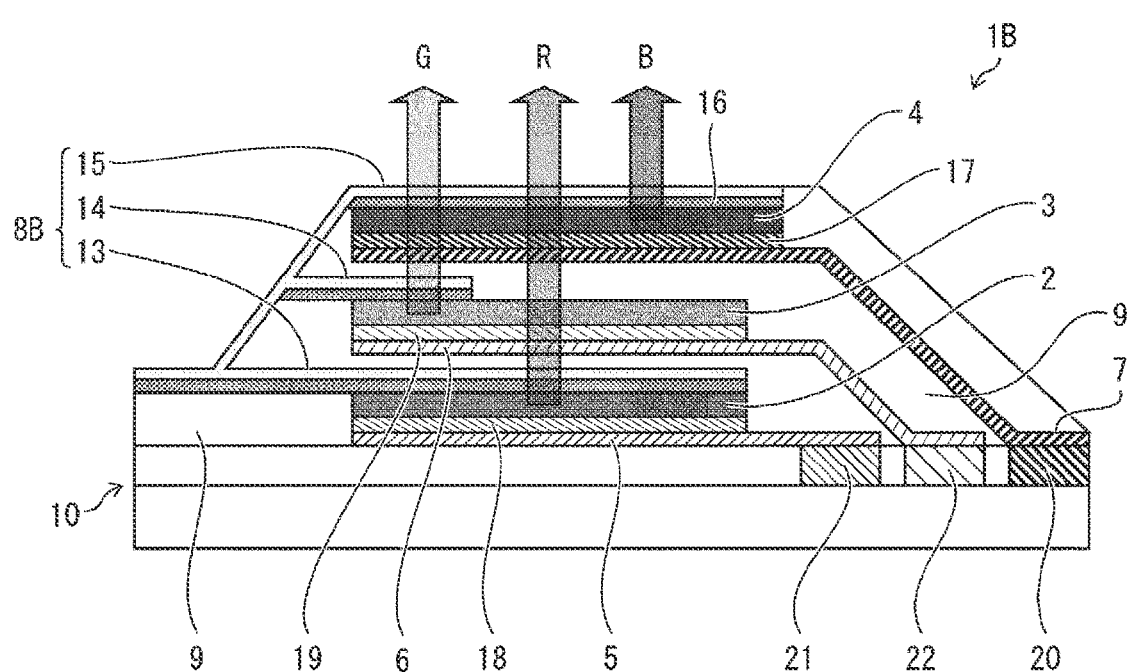
FIG. 12 is a cross-sectional view of a display device according to a third embodiment.

FIG. 12 is a cross-sectional view of a display device 1B according to a third embodiment. Constituent elements similar to the constituent elements described above are given the same reference numerals, and detailed descriptions thereof are not repeated.

The display device 1B has a structure in which each layer of a red light-emitting layer 2, a green light-emitting layer 3, and a blue light-emitting layer 4 is independently layered. The red light-emitting layer 2 and the green light-emitting layer 3 are disposed in different planes, and the green light-emitting layer 3 is disposed between the red light-emitting layer 2 and the blue light-emitting layer 4.

A light-emitting area of the blue light-emitting layer 4 is greater than a light-emitting area of the red light-emitting layer 2, and the light-emitting area of the red light-emitting layer 2 is greater than a light-emitting area of the green light-emitting layer 3.

As illustrated in FIG. 12, the display device 1B includes a common electrode SB having first polarity and being electrically connected to all of the red light-emitting layer 2, the green light-emitting layer 3, and the blue light-emitting layer 4, a first electrode 5 having second polarity opposite to the first polarity and being electrically connected to the red light-emitting layer 2, a second electrode 6 having the second polarity and being electrically connected to the green light-emitting layer 3, and a third electrode 7 having the second polarity and being electrically connected to the blue light-emitting layer 4.

The first electrode 5 is provided on an opposite side to the green light-emitting layer 3 with respect to the red light-emitting layer 2, the second electrode 6 is provided on the red light-emitting layer 2 side with respect to the green light-emitting layer 3, and the third electrode 7 is provided on the green light-emitting layer 3 side with respect to the blue light-emitting layer 4.

The common electrode SB includes a third common electrode portion 13 provided on the green light-emitting layer 3 side with respect to the red light-emitting layer 2 in order to be electrically connected to the red light-emitting layer 2, a fourth common electrode portion 14 provided on the blue light-emitting layer 4 side with respect to the green light-emitting layer 3 in order to be electrically connected to the green light-emitting layer 3, and a fifth common electrode portion 15 provided on an opposite side to the green light-emitting layer 3 with respect to the blue light-emitting layer 4 in order to be electrically connected to the blue light-emitting layer 4.

A portion of a partition 9 between the blue light-emitting layer 4 and the green light-emitting layer 3, and a portion of the partition 9 between the green light-emitting layer 3 and the red light-emitting layer 2 have transparency.

Similarly to the first and second embodiments, the structure of the third embodiment can also obtain the effect of making luminance uniform and the effect of making an anode common.

Similarly to the display device 1 according to the first embodiment, the display device 1B according to the third embodiment can also be manufactured by using a known thin film transistor preparation step, a known wiring line material, and a known mask.

The display device 1B according to the third embodiment is manufactured by a manufacturing method including: a first electrode formation step of forming, on a substrate 10, the first electrode 5 for being electrically connected to the red light-emitting layer 2; a red light-emitting layer formation step of forming the red light-emitting layer 2 on the first electrode 5; a third common electrode formation step of forming the third common electrode portion 13 on the red light-emitting layer 2; a second electrode formation step of forming, on the third common electrode portion 13, the second electrode 6 for being electrically connected to the green light-emitting layer 3; a green light-emitting layer formation step of forming the green light-emitting layer 3 on the second electrode 6; a fourth common electrode formation step of forming the fourth common electrode portion 14 on the green light-emitting layer 3; a third electrode formation step of forming, on the fourth common electrode portion 14, the third electrode 7 for being electrically connected to the blue light-emitting layer 4; a blue light-emitting layer formation step of forming the blue light-emitting layer 4 on the third electrode 7; and a fifth common electrode formation step of forming the fifth common electrode portion 15 on the blue light-emitting layer 4. The light-emitting area of the blue light-emitting layer 4 is greater than the light-emitting area of the red light-emitting layer 2, and the light-emitting area of the red light-emitting layer 2 is greater than the light-emitting area of the green light-emitting layer 3.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

Fourth Embodiment

In the present embodiment, an example of a configuration for achieving a display device (light-emitting device) having improved transparency will be described.

Figure 13:
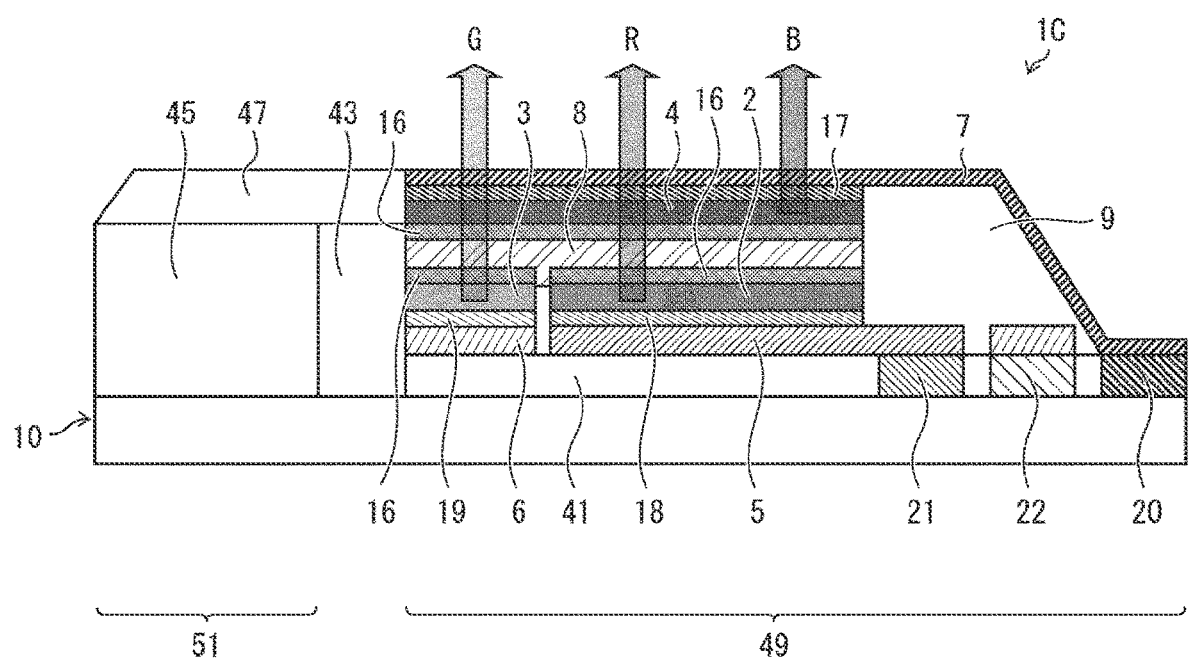
FIG. 13 is a cross-sectional view of a display device according to a fourth embodiment.

FIG. 13 is a cross-sectional view of a display device 1C according to the present embodiment. Constituent elements similar to the constituent elements described above are given the same reference numerals, and detailed descriptions thereof are not repeated.

The display device 1C includes, on a transparent substrate 10, a first electrode (red pixel electrode) 5 and a second electrode (green pixel electrode) 6 as a lower layer pixel electrode provided in an island shape via an insulating layer 41 as appropriate, a common electrode 8 common to a plurality of subpixels, and a third electrode (blue pixel electrode) 7 provided in an island shape, in order from a substrate 10 side. Further, the display device 1C includes a transparent region 51 adjacent to a light-emitting region 49 including a position overlapping a red light-emitting layer 2, a green light-emitting layer 3, and a blue light-emitting layer 4 in a plan view, and has a configuration in which at least a part of the blue light-emitting layer 4 overlaps the red light-emitting layer 2 and the green light-emitting layer 3 adjacent to the red light-emitting layer 2 in the plan view.

Further, a transparent subpixel 45 is included in the transparent region 51 in the display device 1C. Here, a material constituting the transparent subpixel 45 may be the same as a material of the substrate 10. In a broad sense, both the material of the substrate 10 and a transparent material may be configured to include an identical transparent material. In this way, a refractive index difference between the substrate 10 and the transparent subpixel 45 is reduced to improve transparency.

Further, the transparent subpixel 45 may be formed of a transparent material in a visible range. Examples of the material include, for example, $SiO_2$ (n to 1.5), SiN (n to 2.0), $Al_2O_3$ (n to 1.75, AlN (n to 2.2), or a resin such as an acrylic resin, a polyimide resin, or a novolac-type phenol resin. Further, a transparent conductive material such as MgO (n to 1.75) or NiO can also be used as the material. When the material is made common to a common hole transport layer 16, another target does not need to be prepared in a film forming device during production.

Note that, when the refractive index of the material of the transparent subpixel 45 has a great difference from the refractive index of the substrate 10 and a partition 43, reflectivity at an interface increases, and thus transmittance decreases and interference is also likely to occur. Thus, a soda glass (n to 1.51), a non-alkaline glass (n to 1.52), a silica glass (n to 1.46), and the like are used as the material of the substrate 10.

Further, when the material of the substrate 10 is a resin, it is preferable that the transparent subpixel 45 is also a resin of the same material. In this way, the refractive index difference between the substrate 10 and the transparent subpixel 45 is reduced, reflection is less likely to occur, and a film can also be formed by application. Thus, degradation does not occur due to heat and the like during sputtering.

Further, when the material of the substrate 10 is glass, the refractive index difference is reduced by using $SiO_2$ as the material of the transparent subpixel 45. When a material having a high refractive index such as SiN is used as a sealing layer 47, a resin such as a polyimide or a polyethylene naphthalate having an intermediate refractive index between the substrate 10 and the sealing layer 47, and a material such as SiN or $AL_2O_3$ are preferably used as the material of the transparent subpixel 45. Further, the glass being the substrate 10 may also be etched to prepare the light-emitting region 49 in the region.

Hereinafter, description is given on an assumption that the light-emitting region 49 described above is configured to include a light-emitting surface closer to the blue light-emitting layer 4 side than the red light-emitting layer 2 and the green light-emitting layer 3. A design that can improve light extraction efficiency can be achieved by performing single-side light emission. Further, when a back face portion of the light-emitting region 49 is opaque, the red light-emitting layer 2 and the green light-emitting layer 3 do not perform PL light emission by blue light included in background light. As another aspect, the display device 1C may perform double-side light emission including a light-emitting surface on the blue light-emitting layer 4 side and the substrate 10 side. The blue light-emitting layer 4 may include a region that does not overlap the lower layer pixel electrode in the plan view.

It is preferable that the first electrode 5 and the second electrode 6 being the farthest electrodes from the light-emitting surface among the pixel electrodes are each a reflective electrode, and the third electrode 7 located closer to the light-emitting surface side is a transmissive electrode. In this way, the light extraction efficiency from each light-emitting layer improves. Further, an effect of reducing coloration by an absorption layer is noticeable.

Further, the red light-emitting layer 2 and the green light-emitting layer 3 that are likely to excite are located on the substrate 10 side, and thus an influence of incident light especially from a front surface of the display device can be suppressed. In this way, photoexcitation can be suppressed, and an effect of improving white balance can be expected.

Further, the display device 1C includes an absorption layer that is located between the red light-emitting layer 2 and the green light-emitting layer 3, and the blue light-emitting layer 4, the absorption layer being configured to absorb the blue light. In this way, absorption of the blue light by the red light-emitting layer 2 and the green light-emitting layer 3 can be suppressed. Note that, in the example in FIG. 13, the common electrode 8 is configured to serve as the absorption layer. From another aspect, the absorption layer is configured to include an electrode of at least one layer between the red light-emitting layer 2 and the green light-emitting layer 3, and the blue light-emitting layer 4.

Note that the common hole transport layer 16 may be configured to serve as the absorption layer. Further, examples of a conductive material that can be used for the common electrode 8 and the common hole transport layer 16, that absorbs the blue light, that and transmits the red light and the green light include, for example, a material including a silver fine particle, a silver paste, and the like.

Further, at least the red light-emitting layer 2 and the green light-emitting layer 3 include a quantum dot. In this way, a light emission spectrum of each color is narrow, and thus color reproducibility of a display is high. Further, the red light-emitting layer 2 and the green light-emitting layer 3 can be efficiently caused to emit light.

In the example in FIG. 1:3, the common electrode 8 may be configured to serve as a charge transport layer (common hole transport layer 16). From another aspect, the absorption layer may be configured to include the charge transport layer of at least one layer between the red light-emitting layer 2 and the green light-emitting layer 3, and the blue light-emitting layer 4.

The partition 43 is provided on the substrate 10, and is located between the transparent subpixel 45 and the light-emitting region 49 in the plan view. Further, it is preferable that the partition 43 absorbs at least the blue light, and has a height covering a periphery of at least the red light-emitting layer 2 and the green light-emitting layer 3. In this way, incidence of the blue light on the red light-emitting layer 2 or the green light-emitting layer 3 via the partition 43 can be more efficiently reduced.

The sealing layer 47 overlaps both the transparent region 51 and the partition 43 on the light-emitting surface side in the plan view. As an example, the material of the substrate 10 may be a glass material, and the transparent material included in the transparent subpixel 45 may have an intermediate refractive index between a refractive index of the glass material and a refractive index of the material of the sealing layer 47. In this way, interface reflection between the substrate 10 and the sealing layer 47 is suppressed to improve transparency.

Note that, similarly to the first embodiment, a ratio of a light-emitting area of the red light-emitting layer 2, a light-emitting area of the green light-emitting layer 3, and a light-emitting area of the blue light-emitting layer 4 is preferably determined according to a ratio of a luminous efficiency of the red light-emitting layer 2 and a luminosity factor of light from the red light-emitting layer 2, a luminous efficiency of the green light-emitting layer 3 and a luminosity factor of light from the green light-emitting layer 3, and a luminous efficiency of the blue light-emitting layer 4 and a luminosity factor of light from the blue light-emitting layer 4.

Further, the ratio is preferably determined according to a ratio of an inverse of a multiplication value of the luminous efficiency of the red light-emitting layer 2 and the luminosity factor of the light from the red light-emitting layer 2, an inverse of a multiplication value of the luminous efficiency of the green light-emitting layer 3 and the luminosity factor of the light from the green light-emitting layer 3, and an inverse of a multiplication value of the luminous efficiency of the blue light-emitting layer 4 and the luminosity factor of the light from the blue light-emitting layer 4.

Figure 14:
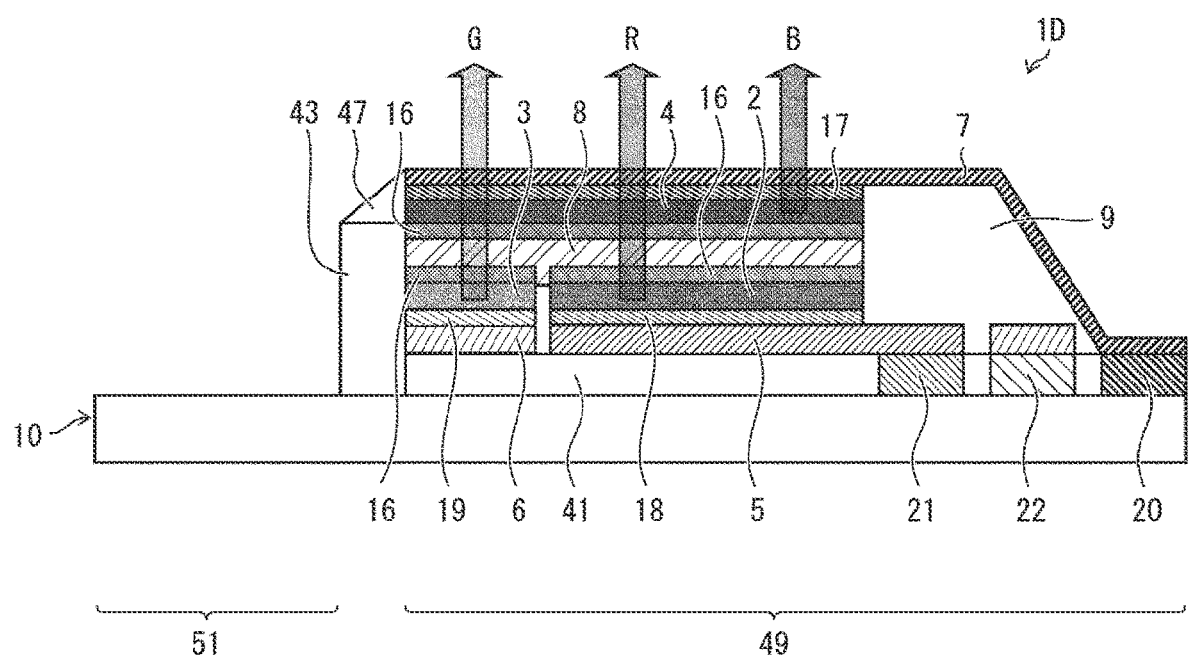
FIG. 14 is a cross-sectional view of the display device according to the fourth embodiment.

Another aspect of the display device according to the present embodiment will be described. FIG. 14 is a cross-sectional view of a display device 1D. A gap is located adjacent to the light-emitting region 49 via the partition 43 in the display device 1D. In other words, the display device 1D does not include the transparent subpixel 45, and the gap overlaps the transparent region 51.

A configuration including only the substrate 10 in the transparent region 51 does not need a step of forming the transparent material of the transparent subpixel 45, and transparency of the transparent region 51 improves. Note that, as exemplified in the configuration in FIG. 14, a cross-sectional shape of the sealing layer 47 may be or may not be a triangle.

Figure 21:
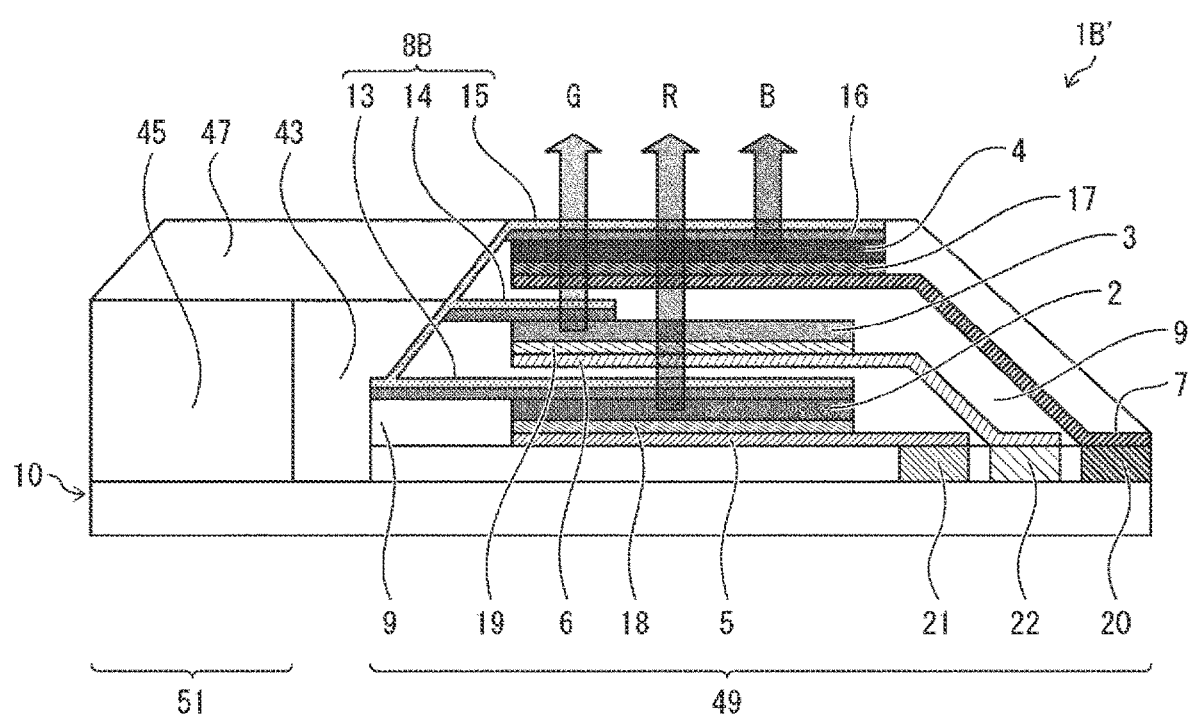
FIG. 21 is a cross-sectional view of the display device according to the fourth embodiment.

As another aspect, a configuration in which the display device includes the transparent region 51 may be a configuration that is the configuration described above in the third embodiment and that is applied in combination with a configuration in which light-emitting layers of RGB overlap each other in the plan view. FIG. 21 is a cross-sectional view of a display device 1B' having the configuration. The display device 1B' related to the configuration includes a first anode electrode, a first cathode electrode, a second anode electrode, a second cathode electrode, a third anode electrode, a third cathode electrode, the red light-emitting layer 2 located between the first anode electrode and the first cathode electrode, the green light-emitting layer 3 located between the second anode electrode and the second cathode electrode, the blue light-emitting layer 4 located between the third anode electrode and the third cathode electrode, and the transparent region adjacent to the light-emitting region including a position overlapping the red light-emitting layer 2, the green light-emitting layer 3, and the blue light-emitting layer 4 in a plan view. The red light-emitting layer 2, the green light-emitting layer 3, and the blue light-emitting layer 4 overlap each other in the plan view. In this way, a transparent light-emitting device including a three-layer tandem light-emitting element can be provided. Note that, as exemplified in the common electrode 8B in FIG. 21, for example, an electrode having any polarity may be or may not be common. Further, the first anode electrode may be any of the electrode 5 and the electrode 13 in FIG. 21. Further, the second anode electrode may be any of the electrode 6 and the electrode 14. Further, the third anode electrode may be any of the electrode 7 and the electrode 15.

In the present embodiment, a plurality of pixels each including a plurality of subpixels of RUB are provided to display an image in a display region. It is described above that the common electrode is common to the plurality of subpixels, but the common electrode may be provided to be common to the plurality of pixels across the display region. Further, in the present embodiment, the display device including the plurality of subpixels of RGB is described, but the present embodiment is not limited thereto. For example, as another aspect, the configuration in which the display device includes the transparent region can also be applied to a display device (light-emitting device) including a single light-emitting element, light-emitting elements of two colors, or light-emitting elements of four or more colors.

Next, an example of a manufacturing method for the display device 1C is illustrated. FIGS. 15(a) to (d) are cross-sectional views illustrating the manufacturing method for the display device 1C. Constituent elements similar to the constituent elements described above are given the same reference numerals, and detailed descriptions thereof are not repeated.

Figure 15:
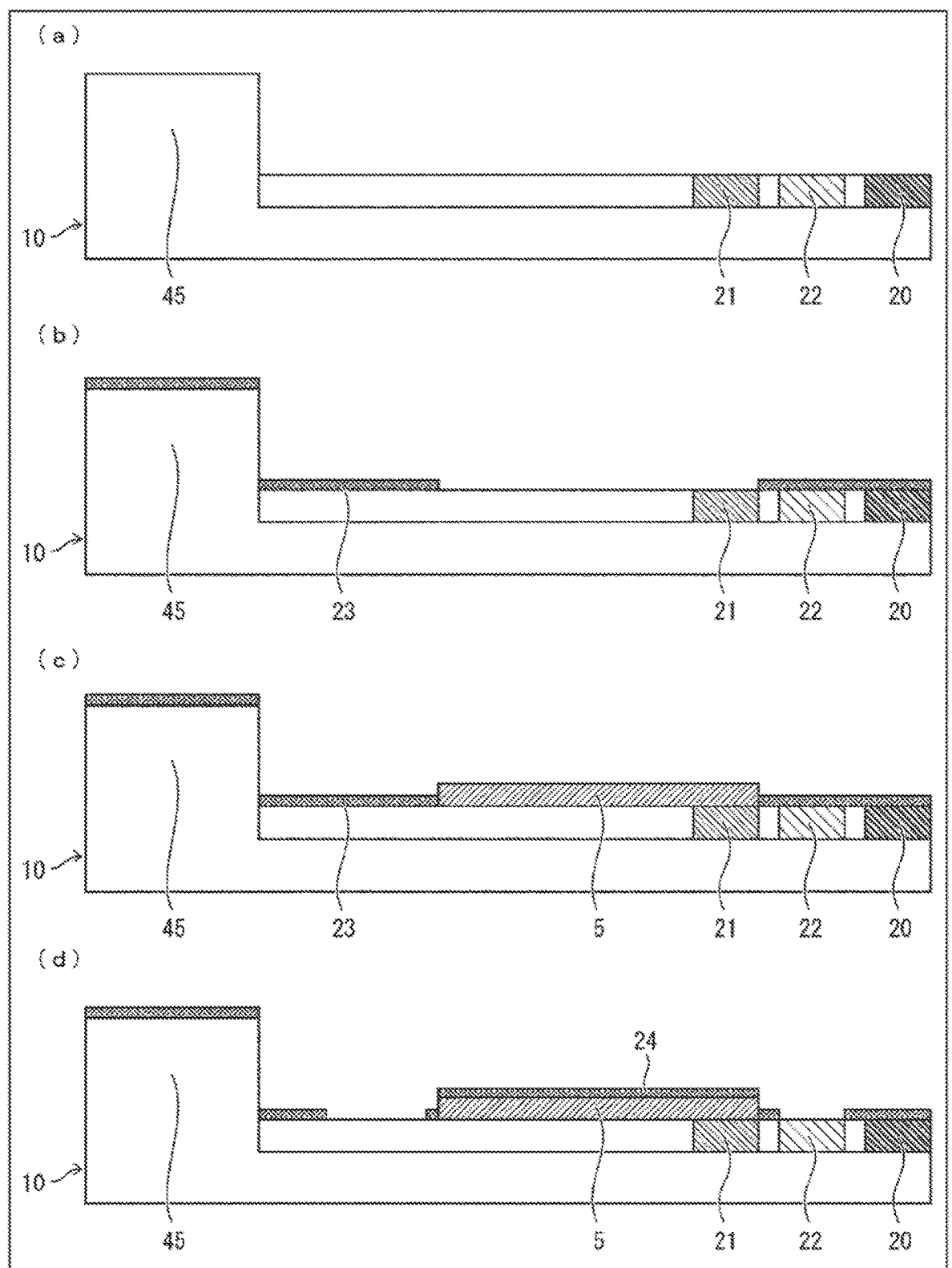
FIGS. 15($a$) to ($d$) are cross-sectional views illustrating a manufacturing method for a display device.

A known thin film transistor preparation step, a known wiring line material, and a known mask can be used in the manufacturing method for the display device 1C. In order to prepare the display device 1C according to the present embodiment, first, as illustrated in FIG. 15(b), a mask 23 for forming the first electrode 5 is formed on the leveled substrate 10 on which a first thin film transistor 21, a second thin film transistor 22, and a third thin film transistor 20 illustrated in FIG. 15(a) are formed. Note that the substrate 10 illustrated in FIG. 15(a) is made leveled by performing etching on a portion other than in the transparent region 51. The mask 23 is a photomask by photolithography using a metal mask or a photoresist.

Then, as illustrated in FIG. 15(c), the first electrode 5 to become a cathode wiring line to the red light-emitting layer 2 is formed by a means such as sputtering, vapor deposition, and application. Next, the mask 23 is removed from the substrate 10, and, as illustrated in FIG. 15(d), a mask 24 for forming the second electrode 6 to become a cathode wiring line to the green light-emitting layer 3 is then formed.

FIGS. 16(a) to (d) are cross-sectional views illustrating the manufacturing method for the display device 1C. Constituent elements similar to the constituent elements described above are given the same reference numerals, and detailed descriptions thereof are not repeated.

Figure 16:
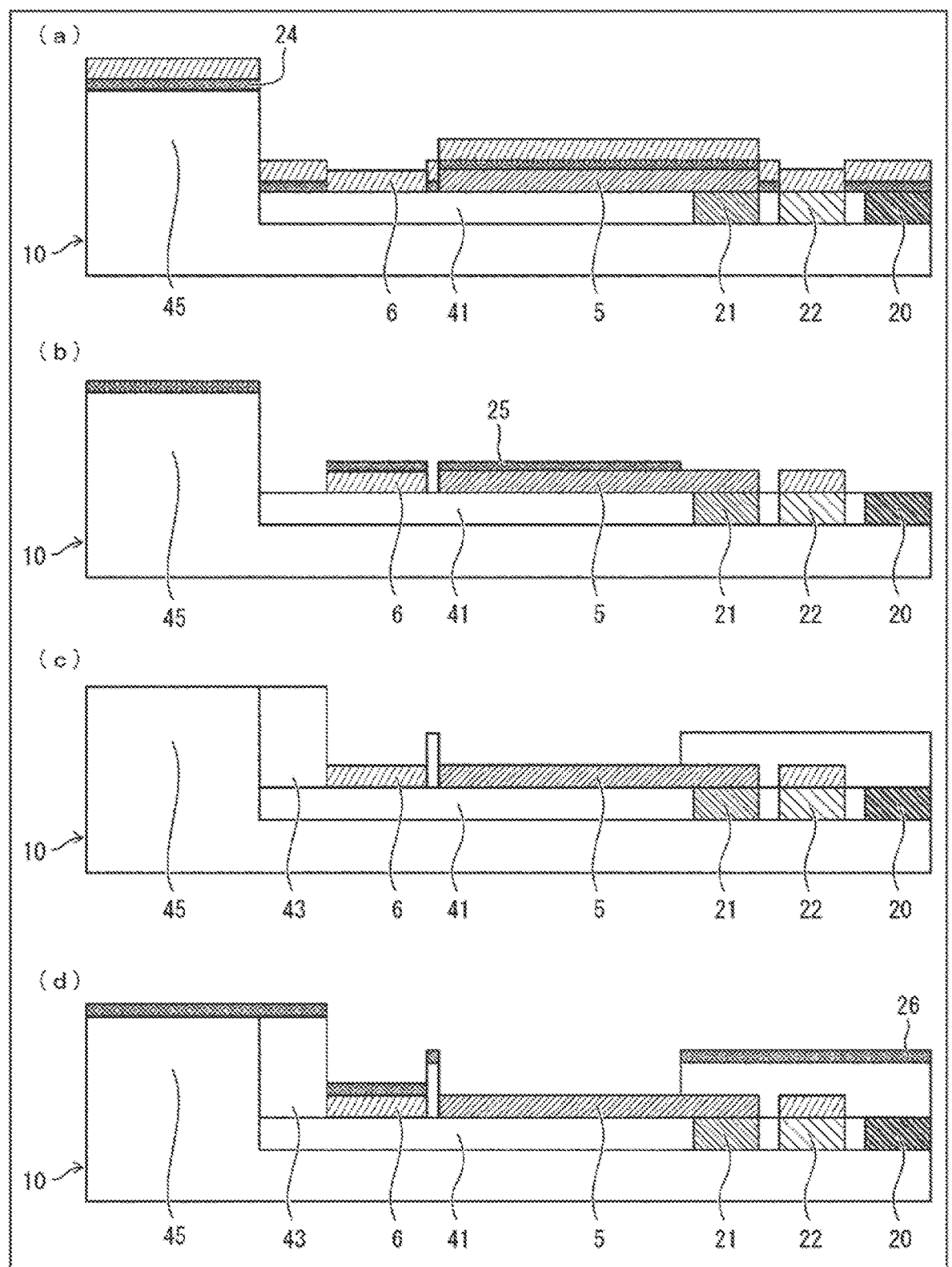
FIGS. 16($a$) to ($d$) are cross-sectional views illustrating the manufacturing method for a display device.

Subsequently, as illustrated in FIG. 16(a), the second electrode 6 to become the cathode wiring line to the green light-emitting layer 3 is formed by using the mask 24 by a means similar to that above such as sputtering, vapor deposition, and application.

Then, the mask 24 is removed, and, as illustrated in FIG. 16(b), a mask 25 for forming the partition 43 is formed on the first electrode 5 and the second electrode 6. Next, as illustrated in FIG. 16(c), after the partition 43 is formed by the mask 25, the mask 25 is removed. Further, the partition 43 is preferably prepared to a height of glass of the transparent subpixel 45. An opening of the mask 25 is a region in which the red light-emitting layer 2 and the green light-emitting layer 3 are disposed. Note that, as another means for forming the partition 43, a partition material may be applied to the entire surface of the substrate 10, and ashing or etching may be performed on an area unnecessary to form the partition 43 via the mask 25. Subsequently, as illustrated in FIG. 16(d), a mask 26 open in a region for forming the red light-emitting layer 2 is formed.

Figure 17:
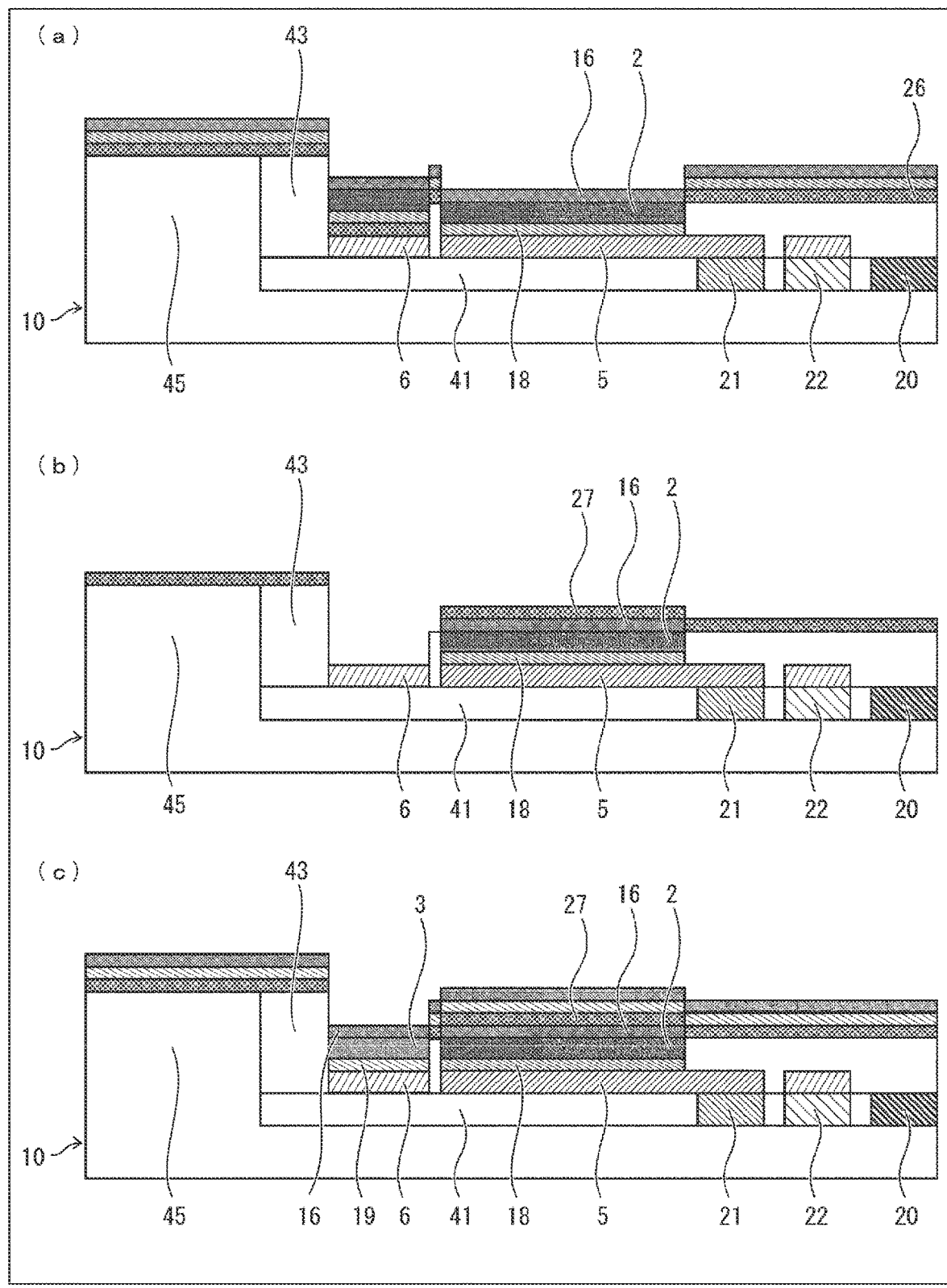
FIGS. 17($a$) to ($c$) are cross-sectional views illustrating the manufacturing method for a display device.

FIGS. 17(a) to (c) are cross-sectional views illustrating the manufacturing method for the display device 1C. Constituent elements similar to the constituent elements described above are given the same reference numerals, and detailed descriptions thereof are not repeated.

Then, the first electron transport layer 18 is formed on the first electrode 5 by a means similar to that above such as sputtering, vapor deposition, and application. Next, while using the same mask 26, the red light-emitting layer 2 and the common hole transport layer 16 are formed on the first electron transport layer 18 so as to be layered in this order. The red light-emitting layer 2 can be formed by using colloidal solution application, printing by ink-jet and the like, or a transfer method. The common hole transport layer 16 is formed by a means similar to the means for forming the first electron transport layer 18.

Subsequently, as illustrated in FIG. 17(b), the mask 26 is removed and replaced with a mask 27 for the green light-emitting layer 3. Then, as illustrated in FIG. 17(c), a second electron transport layer 19, the green light-emitting layer 3, and the common hole transport layer 16 are formed on the second electrode 6 so as to be layered in this order. At this time, the common hole transport layer 16 formed on the red light-emitting; layer 2 serves a function of protecting the red light-emitting layer 2 from process damage by a solvent for a photomask.

Figure 18:
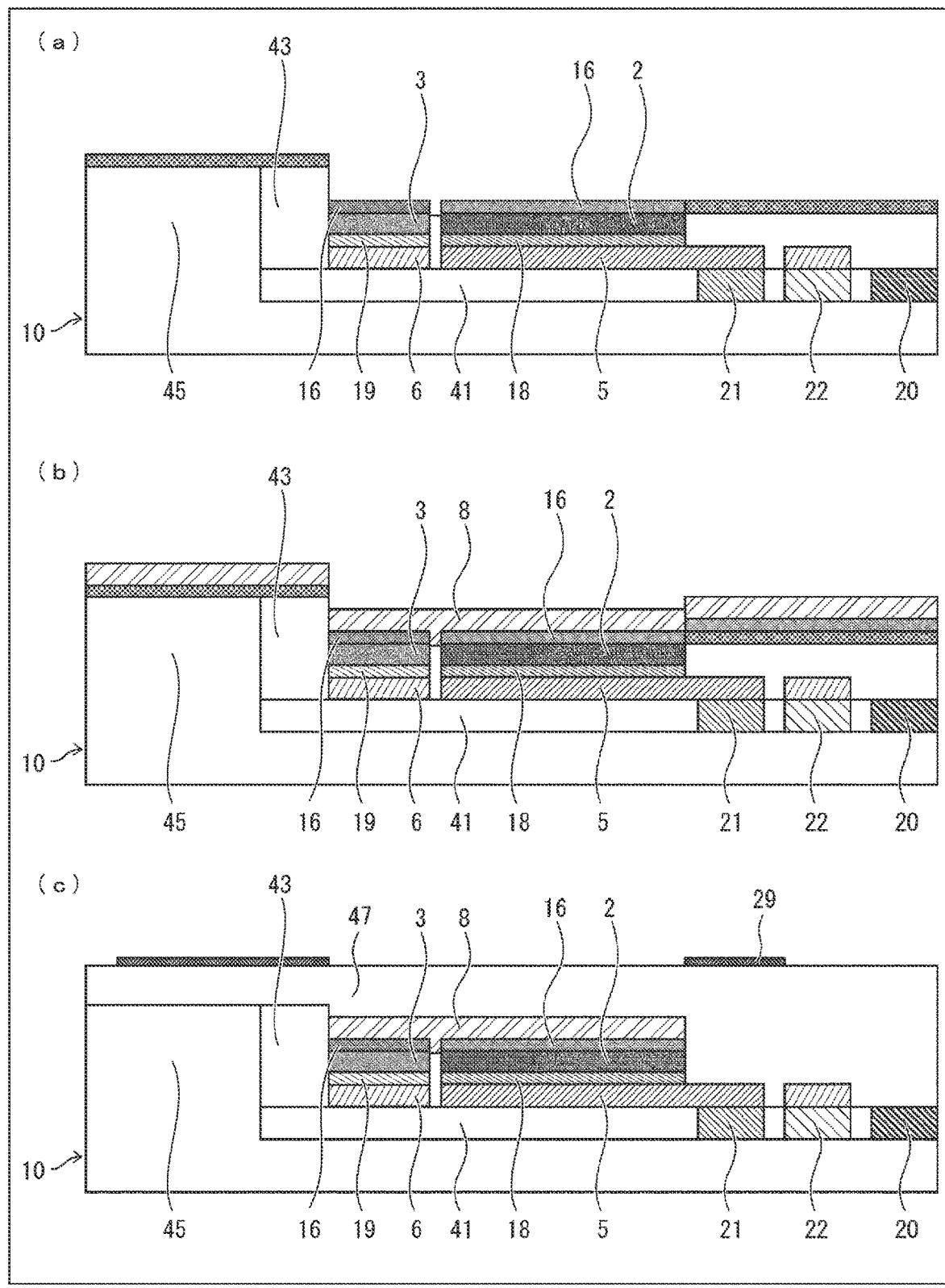
FIGS. 18($a$) to ($c$) are cross-sectional views illustrating the manufacturing method for a display device.

FIGS. 18(a) to (c) are cross-sectional views illustrating the manufacturing method for the display device 1C. Constituent elements similar to the constituent elements described above are given the same reference numerals, and detailed descriptions thereof are not repeated.

Next, as illustrated in FIG. 18(a), the mask 27 is removed and replaced with a mask 28 for forming the common electrode 8 to become a common anode. Subsequently, the common electrode 8 is formed as illustrated in FIG. 18(b). Then, as illustrated in FIG. 18(c), the mask 28 is removed, and the entire surface of the substrate 10 is covered with the sealing layer 47. Next, a mask 29 is formed on a surface of the sealing layer 47.

Figure 19:
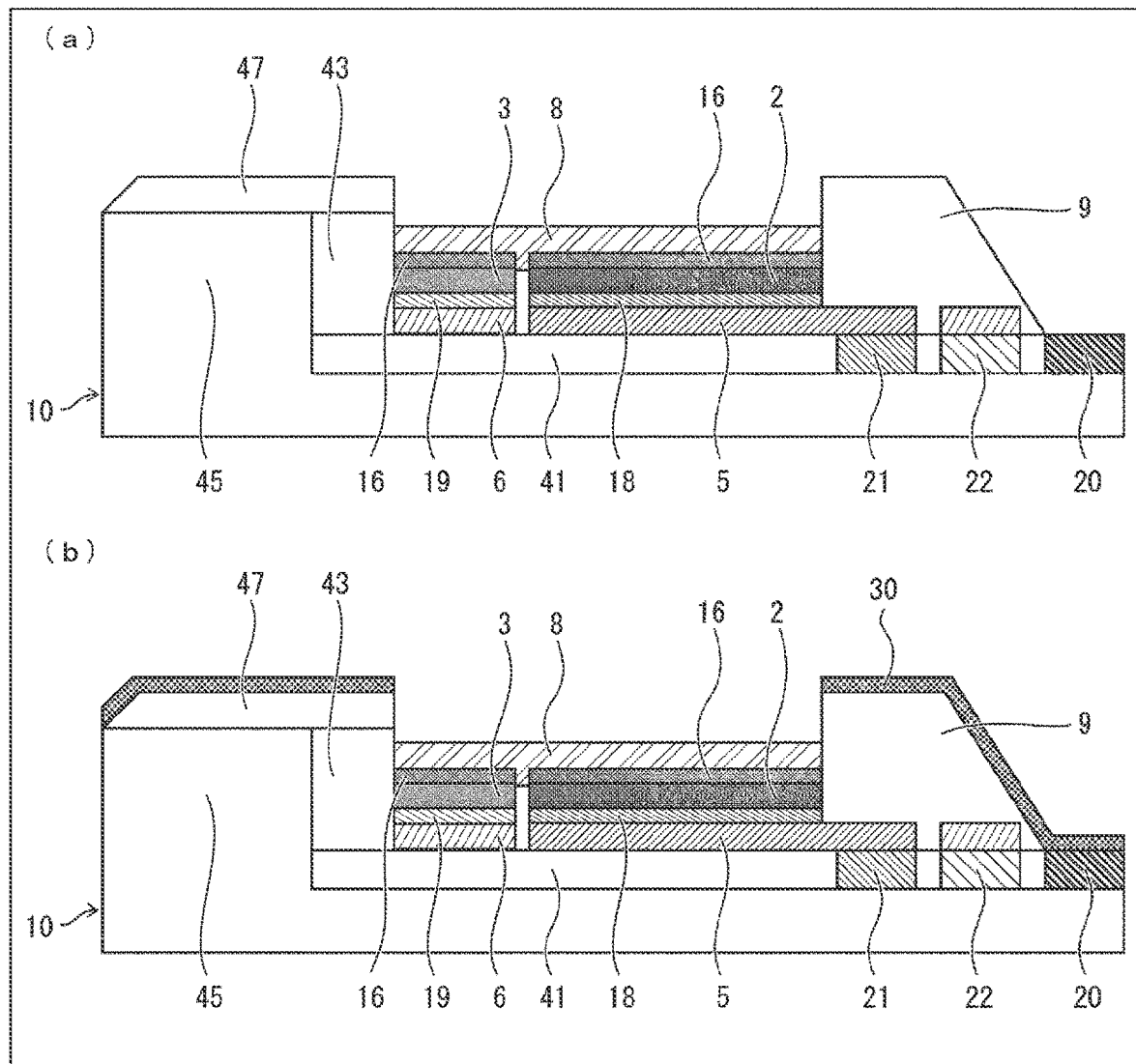
FIGS. 19($a$) and ($b$) are cross-sectional views illustrating the manufacturing method for a display device.

FIGS. 19(a) and (b) are cross-sectional views illustrating the manufacturing method for the display device 1C. Constituent elements similar to the constituent elements described above are given the same reference numerals, and detailed descriptions thereof are not repeated.

Then, as illustrated in FIG. 19(a), after ashing or etching is performed on the surface of the sealing layer 47, the mask 29 is removed. Next, as illustrated in FIG. 19(b), a mask 30 for the blue light-emitting layer 4 is formed.

Figure 20:
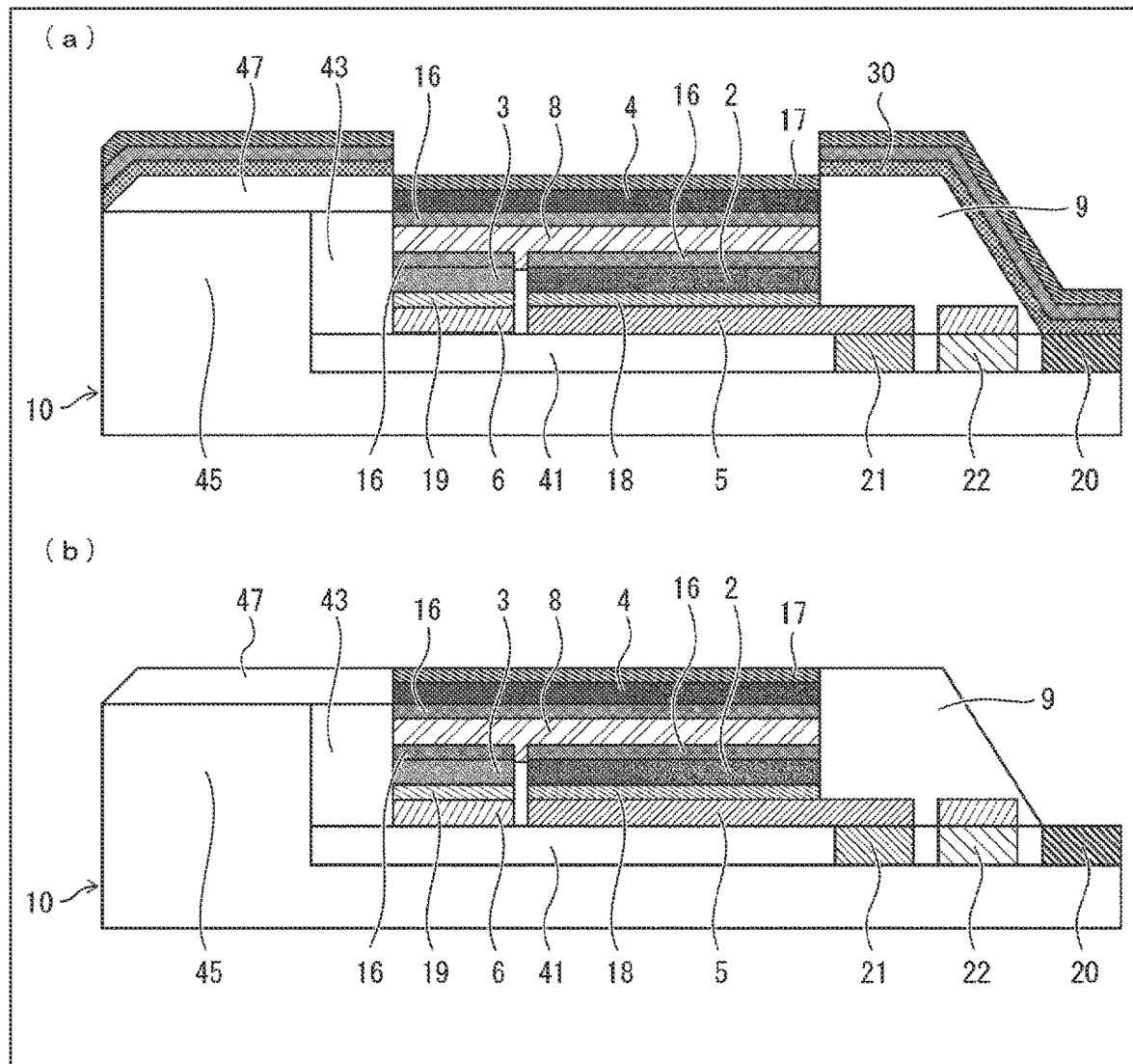
FIGS. 20($a$) and ($b$) are cross-sectional views illustrating the manufacturing method for a display device.

FIGS. 20(a) and (b) are cross-sectional views illustrating the manufacturing method for the display device 1C. Subsequently, as illustrated in FIG. 20(a), the common hole transport layer 16, the blue light-emitting layer 4, and a third electron transport layer 17 are formed on the common electrode 8 so as to be layered in this order. Then, as illustrated in FIG. 20(b), the mask 30 is removed.

Figure 10:
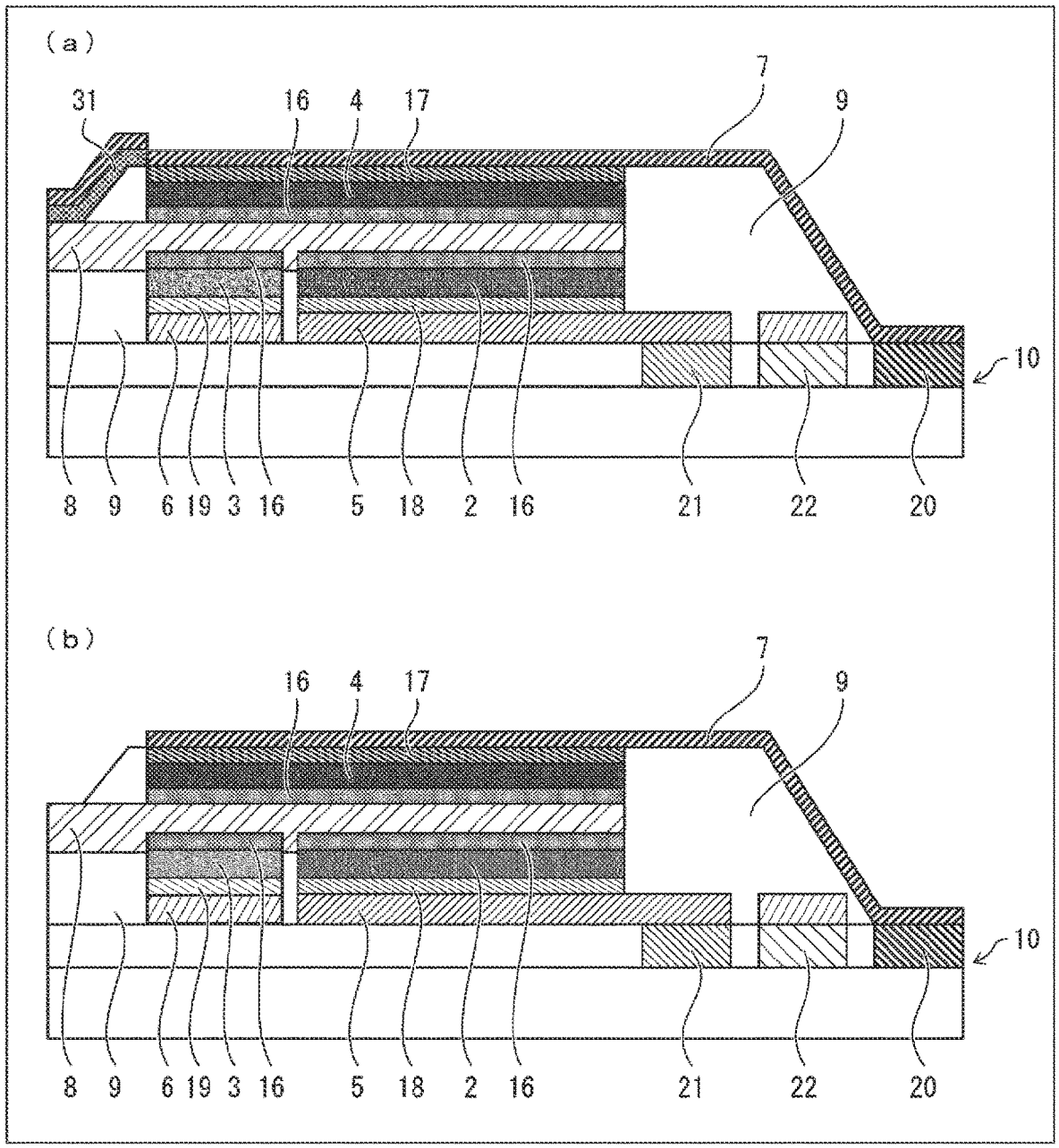
FIGS. 10($a$) and ($b$) are cross-sectional views illustrating the manufacturing method for the display device.

Next, as a step corresponding to FIG. 10, the third electrode 7 to become a cathode of the blue light-emitting layer 4 is formed via a mask 31, the mask 31 is removed, and an element structure of the display device 1C is completed. Subsequently, the common electrode 8 to become an exposed common anode and the substrate 10 are wired, the entire panel is sealed, and the display device 1C is completed.

REFERENCE SIGNS LIST

1 Display device
2 Red light-emitting layer
3 Green light-emitting layer
4 Blue light-emitting layer
5 First electrode
6 Second electrode
7 Third electrode
8 Common electrode
9, 43 Partition
10 Substrate
11 First common electrode portion
12 Second common electrode portion
13 Third common electrode portion
14 Fourth common electrode portion
15 Fifth common electrode portion
45 Transparent subpixel
47 Sealing layer
49 Light-emitting region (opaque region)
51 Transparent region

The invention claimed is:

1. A light-emitting device comprising:
on a substrate, a lower layer pixel electrode forming an island shape, a common electrode being common to a plurality of subpixels, and a blue pixel electrode forming an island shape, provided in this order from a substrate side;
the lower layer pixel electrode including a red pixel electrode and a green pixel electrode adjacent to the red pixel electrode;
a red light-emitting layer located between the red pixel electrode and the common electrode;
a green light-emitting layer located between the green pixel electrode and the common electrode;
a blue light-emitting layer located between the common electrode and the blue pixel electrode;
a transparent region adjacent to a light-emitting region that includes a position overlapping the red light-emitting layer, the green light-emitting layer, and the blue light-emitting layer in a cross-sectional view; and
a sealing layer overlapping the transparent region on a light-emitting surface side in the cross-sectional view,
wherein at least a part of the blue light-emitting layer overlaps the red light-emitting layer and the green light-emitting layer in the cross-sectional view,
the light-emitting region further includes a light-emitting surface closer to the blue light-emitting layer than the red light-emitting layer and the green light-emitting layer,
the transparent region includes a transparent subpixel, and
the transparent subpixel is in contact with the sealing layer.

2. The light-emitting device according to claim 1, further comprising
an absorption layer located between the red light-emitting layer and the green light-emitting layer, and the blue light-emitting layer, the absorption layer being configured to absorb blue light.

3. The light-emitting device according to claim 1, further comprising
a partition provided between the transparent region and the light-emitting region in the cross-sectional view.

4. The light-emitting device according to claim 3,
wherein the partition is provided on the substrate, and has a height covering a periphery of at least the red light-emitting layer and the green light-emitting layer.

5. The light-emitting device according to claim 3,
wherein the partition absorbs at least blue light.

6. The light-emitting device according to claim 1,
wherein the red pixel electrode and the green pixel electrode are each a reflective electrode, and the common electrode and the blue pixel electrode are each a transmissive electrode.

7. The light-emitting device according to claim 1,
wherein both a material of the substrate and a transparent material included in the transparent region include an identical transparent material.

8. The light-emitting device according to claim 7,
wherein the material of the substrate and the transparent material are an identical material.

9. The light-emitting device according to claim 1,
wherein a gap adjacent to the light-emitting region is provided on the substrate, and the gap overlaps the transparent region.

10. The light-emitting device according to claim 1,
wherein a ratio of a light-emitting area of the red light-emitting layer, a light-emitting area of the green light-emitting layer, and a light-emitting area of the blue light-emitting layer is determined according to a luminous efficiency of the red light-emitting layer and a luminosity factor of red light, a luminous efficiency of the green light-emitting layer and a luminosity factor of green light, and a luminous efficiency of the blue light-emitting layer and a luminosity factor of blue light.

11. The light-emitting device according to claim 10,
wherein the ratio is determined according to a ratio of an inverse of a multiplication value of the luminous efficiency of the red light-emitting layer and the luminosity factor of the red light, an inverse of a multiplication value of the luminous efficiency of the green light-emitting layer and the luminosity factor of the green light, and an inverse of a multiplication value of the luminous efficiency of the blue light-emitting layer and the luminosity factor of the blue light.

12. The light-emitting device according to claim 2,
wherein the absorption layer includes an electrode of at least one layer between the blue light-emitting layer, and the red light-emitting layer and the green light-emitting layer.

13. The light-emitting device according to claim 2,
wherein the absorption layer includes a charge transport layer of at least one layer between the blue light-emitting layer, and the red light-emitting layer and the green light-emitting layer.

14. The light-emitting device according to claim 1,
wherein at least the red light-emitting layer and the green light-emitting layer include a quantum dot.

15. A light-emitting device comprising:
a first anode electrode;
a first cathode electrode;
a second anode electrode;
a second cathode electrode;
a third anode electrode;
a third cathode electrode;

a red light-emitting layer located between the first anode electrode and the first cathode electrode;
a green light-emitting layer located between the second anode electrode and the second cathode electrode;
a blue light-emitting layer located between the third anode electrode and the third cathode electrode;
a transparent region adjacent to a light-emitting region that includes a position overlapping the red light-emitting layer, the green light-emitting layer, and the blue light-emitting layer in a cross-sectional view; and
a sealing layer overlapping the transparent region on a light-emitting surface side in the cross-sectional view,
wherein the red light-emitting layer, the green light-emitting layer, and the blue light-emitting layer overlap each other in the cross-sectional view,
the light-emitting region further includes a light-emitting surface closer to the blue light-emitting layer than the red light-emitting layer and the green light-emitting layer,
the transparent region includes a transparent subpixel, and
the transparent subpixel is in contact with the sealing layer.

\* \* \* \* \*